United States Patent
Gates, Jr. et al.

(10) Patent No.: US 6,436,204 B1
(45) Date of Patent: Aug. 20, 2002

(54) DIAMOND COATED CUTTING TOOLS AND METHOD OF MANUFACTURE

(75) Inventors: Alfred S. Gates, Jr., Greensburg; Aharon Inspektor, Pittsburgh, both of PA (US)

(73) Assignee: Kennametal PC Inc., Monrovia, CA (US)

( * ) Notice: Subject to any disclaimer, the term of this patent is extended or adjusted under 35 U.S.C. 154(b) by 0 days.

(21) Appl. No.: 09/196,705

(22) Filed: Nov. 20, 1998

(51) Int. Cl.[7] ............................................. C21D 1/74
(52) U.S. Cl. ........................................ 148/527; 148/537
(58) Field of Search .............................. 148/527, 537

(56) References Cited

U.S. PATENT DOCUMENTS

| | | | |
|---|---|---|---|
| 5,068,148 A | 11/1991 | Nakahara et al. | 428/335 |
| 5,217,081 A | 6/1993 | Waldenstrom et al. | 175/420.2 |
| 5,264,283 A | 11/1993 | Waldenstrom et al. | 428/408 |
| 5,335,738 A | 8/1994 | Waldenstrom et al. | 175/420.2 |
| 5,370,944 A | 12/1994 | Omori et al. | 428/565 |
| 5,380,408 A * | 1/1995 | Svensson | 204/129.1 |
| 5,496,638 A | 3/1996 | Waldenstrom et al. | 428/408 |
| 5,585,176 A | 12/1996 | Grab et al. | 428/336 |
| 5,609,447 A | 3/1997 | Britzke et al. | 408/230 |
| 5,628,837 A * | 5/1997 | Britzke et al. | 148/208 |
| 5,648,119 A | 7/1997 | Grab et al. | 427/249 |
| 5,665,431 A | 9/1997 | Narasimhan | 427/255 |
| 5,681,541 A * | 10/1997 | Yoshimura et al. | 428/216 |
| 5,713,133 A | 2/1998 | Bhat et al. | 30/350 |
| 5,718,948 A | 2/1998 | Ederyd et al. | 427/249 |
| 5,806,934 A * | 9/1998 | Massa et al. | 299/111 |
| 5,891,522 A * | 4/1999 | Olson | 427/309 |
| 5,979,579 A * | 11/1999 | Jurewicz | 175/434 |
| 6,080,477 A * | 6/2000 | Narashmhan | 428/336 |

FOREIGN PATENT DOCUMENTS

| | | |
|---|---|---|
| EP | 0519587 A1 | 12/1992 |
| EP | 0530779 | 3/1993 |
| WO | WO9515258 A1 | 6/1995 |
| WO | 9835071 | 8/1998 |

OTHER PUBLICATIONS

Uhrenius, "Phase Diagrams as a tool for production and development of cemented carbides and steels," Powder Metallurgy, vol. 35, No. 3 (1992), pp. 203–210.

Santhanam et al., "Cemented Carbides," Metals Handbook, vol. 2, 10th Ed. (1990), pp. 950–977.

Kennametal brochure entitled "KCD25 Diamond Film Coated Carbide Inserts" (1994).

Katsumura et al., "Effects of cobalt content and surface state on the cutting performance of diamond coated cemented carbide tools for aluminum–18% silicon alloy," Keikinzoku, vol. 39, No. 9 (1989), pp. 634–8 (English translation).

Rüdiger et al., "The Problem of Evaporation of the Binder During the Vacuum Treatment of Cemented Carbides," International Symposium on Powder Metallurgy, Paris, Jun. 1964, pp. 259–269 (English translation).

* cited by examiner

Primary Examiner—Daniel J. Jenkins

(57) ABSTRACT

A process for making a coated body comprising the steps of: providing a substrate comprising tungsten, carbide and cobalt, and the substrate having at least one surface with eta phase thereon; subjecting the substrate with eta phase on the surface thereof to a conversion treatment at a temperature between about 1250° C. and about 2000° C. under at least a partial vacuum for a duration sufficient as to convert at least a portion of the eta phase to fibrous tungsten carbide grains that the fibrous tungsten carbide grains are at the surface whereby the substrate surface presents a surface roughness, $R_a$, of greater than 12 microinches; and applying a coating to the surface of the substrate.

34 Claims, 23 Drawing Sheets

DIAMOND COATED CUTTING TOOLS AND METHOD OF MANUFACTURE

BACKGROUND OF THE INVENTION

The invention pertains to a cutting tool which has a cobalt cemented tungsten carbide substrate with a strongly adherent diamond coating thereon.

In the past, brazed-on polycrystalline diamond (PCD) tipped cutting inserts and cutting inserts, which had have a chemical vapor deposition (CVD) diamond coating, have been used for material removal in certain applications. The workpiece materials for these material removal applications included free-machining aluminum alloys, high silicon aluminum, nonferrous materials (e.g., copper, bronze, and brass), ceramics materials, fiber-reinforced materials, graphite laminates, nylons, acrylics, phenolic resin materials, metal matrix composites (e.g., silicon carbide or alumina in an aluminum matrix), plastic, rubber and wood. While these PCD cutting inserts performed acceptably, these cutting inserts had an inherent disadvantage in that there was only one cutting edge per cutting insert. This was in contrast to a CVD diamond coated cutting insert which had multiple cutting edges, such as shown in U.S. Pat. No. 5,585,176 to Grab et al. (assigned to Kennametal Inc. of Latrobe, Pennsylvania, the assignee of the present patent application). While these earlier CVD diamond coated cutting inserts have performed in an acceptable fashion, there remains the need to develop other processes to produce diamond coated cutting inserts, as well as diamond coated cutting inserts produced by these other processes, which possess the requisite properties to perform in a satisfactory fashion. These properties include that the coating be strongly adherent to the substrate so as to avoid premature flaking, that the thickness of the coating be sufficiently great so as to provide for adequate tool life, and that the sharpness of the cutting edges being sufficiently sharp so as to provide for an acceptable workpiece surface finish (i.e., an acceptable surface roughness).

SUMMARY OF THE INVENTION

In one form thereof, the invention is a coated body which has a substrate made of tungsten, carbon, and cobalt. The substrate presents a surface. Eta phase is present at the surface of the substrate. Fibrous tungsten carbide grains are present at the surface of the substrate. The surface of the substrate has a surface roughness, $R_a$, of greater than about 12 microinches. A coating layer is on the surface of the substrate.

In another form thereof, the invention is a process for making a coated body comprising the steps of: providing a substrate comprising tungsten, carbon and cobalt wherein the substrate has at least one surface with eta phase thereon; subjecting the substrate with eta phase on the surface thereof to a conversion treatment at a temperature between about 1250° C. and about 2000° C. under at least a partial vacuum for a duration sufficient as to convert at least a portion of the eta phase to fibrous tungsten carbide grains whereby the fibrous tungsten carbide grains are at the surface so that the substrate surface presents a surface roughness, $R_a$, of greater than 12 microinches; and applying a coating to the surface of the substrate.

In still another form thereof, the invention is a process for making a coated body comprising the steps of: providing a substrate comprising tungsten, carbon and cobalt; the substrate presenting at least one surface; and the substrate having been subjected to a roughening heat treatment so as to cause grain growth of the tungsten carbide grains so that the surface of the substrate has a surface roughness, $R_a$, of at least 12 microinches, and the roughening heat treatment causing the reduction of the concentration of the cobalt at the surface of the substrate; oxidizing the surface of the substrate which has been subjected to the roughening heat treatment so as to form eta phase at the surface of the substrate; subjecting the substrate with eta phase at the surface thereof to a conversion heat treatment at a temperature between about 1250° C. and about 2000° C. under at least a partial vacuum for a duration sufficient as to convert at least a portion of the eta phase to fibrous tungsten carbide grains so that the fibrous tungsten carbide grains are at the surface wherein the substrate surface presents a surface roughness, $R_a$, of greater than 12 microinches; and applying a coating to the surface of the substrate.

BRIEF DESCRIPTION OF THE DRAWINGS

The following is a brief description of the drawings that form a part of this patent application.

DETAILED DESCRIPTION

Figure 1:
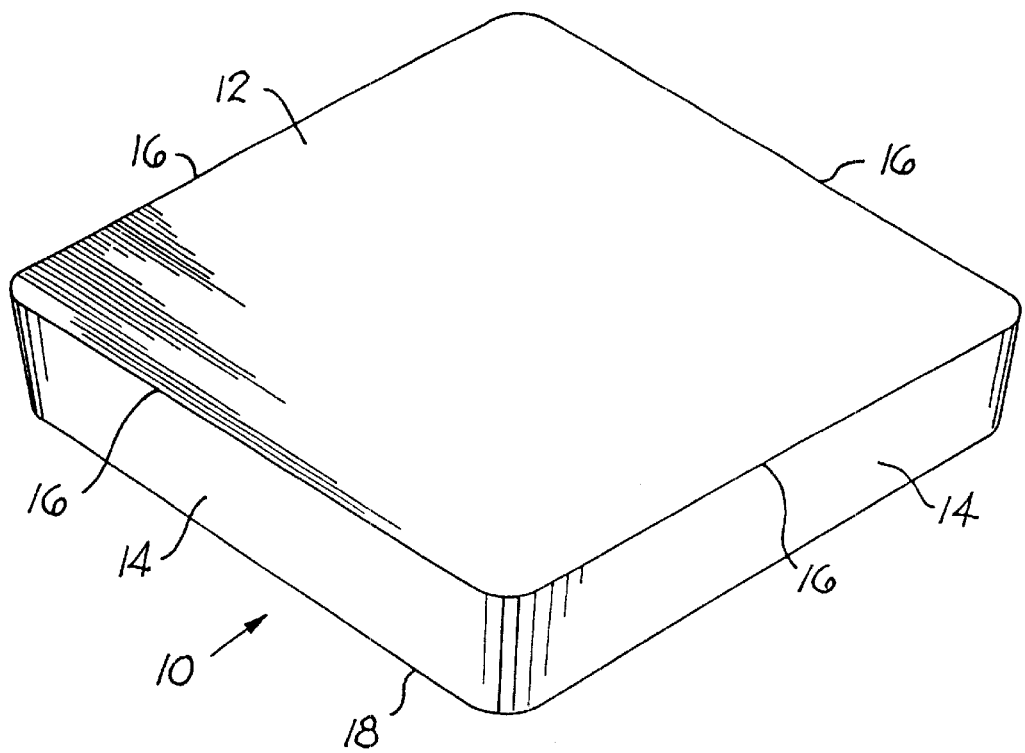
FIG. 1 is an isometric view of a coated cutting insert of the present invention.

Referring to the drawings, FIG. 1 illustrates a specific embodiment of the cutting insert of the invention, generally designated as 10. Cutting insert 10 includes a rake face 12 and a flank face 14 which intersect to form cutting edges 16. Cutting insert 10 further has a bottom surface 18.

Figure 2:
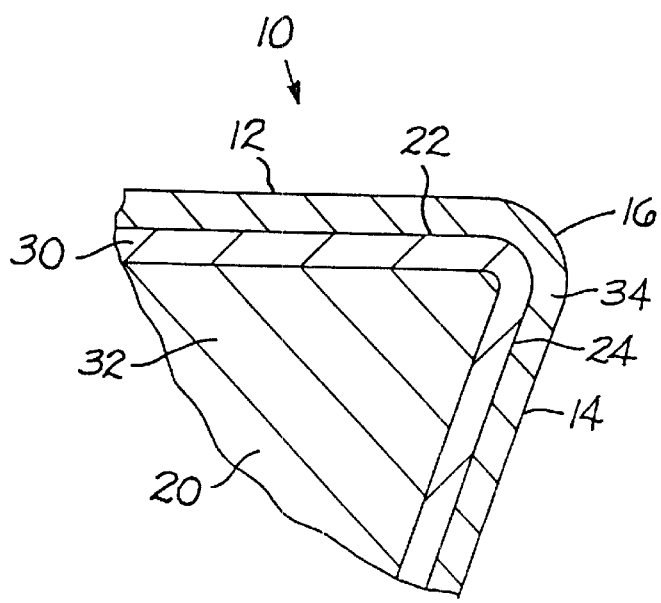
FIG. 2 is a cross-sectional view of a corner of the cutting insert of FIG. 1.

Referring to FIG. 2, cutting insert 10 has a substrate 20 which has a substrate rake surface 22 and a substrate flank surface 24. The substrate 20 also has an exterior region 30 and an interior region 32. The exterior region 30 defines the surfaces (22 and 24) of the substrate 20. The exterior region 30 may extend inwardly from the surfaces (22 and 24) of the substrate a distance between about 1 micrometer and about 50 micrometers. There is a diamond coating 34 on the substrate rake surface 22 and the substrate flank surface 24 of the substrate 20. The diamond coating 34 has a thickness that may be between about 4 micrometers and about 50 micrometers.

The typical substrate material is a tungsten carbide-cobalt alloy with the possibility that there are some additions of other elements such as, for example, tantalum, titanium, niobium, chromium, hafnium and vanadium. These other elements are typically in the form of their simple carbides and/or in solid solution with the tungsten carbide. The cobalt content can range from between about 0.2 weight percent to about 20 weight percent. Two preferred substrate materials comprise grades designated herein as Composition No. 1 and Composition No. 2 in the Table I set forth herein.

TABLE I

Composition and Properties of Compositions Nos. 1 and 2

| Composition/ Property | Comp. No. 1 | Comp. No. 2 |
|---|---|---|
| Cobalt (wt. %) | 2.3–2.9 | 5.7–6.3 |
| Tantalum (wt. %) | up to 0.4 | up to 0.1 |
| Titanium (wt. %) | up to 0.1 | up to 0.1 |
| Niobium (wt. %) | up to 0.1 | up to 0.1 |
| Other (wt. %) | — | Cr = 0.3–0.5 |
| Tungsten & Carbon (wt. %) | Balance | Balance |
| Hardness ($R_a$) | 92.8–93.6 | 92.6–93.4 |
| Coercive Force ($H_C$) Oersteds | 290–440 | 250–320 |
| Specific Gravity (grams/cm$^3$) | 15.10–15.50 | 14.80–15.00 |
| Grain Size (WC) [micrometers] | 1–6 | 1–5 |

Referring to Table I, the compositions are in weight percent, the hardness is in Rockwell ($R_a$), the coercive force is in oersteds, the specific gravity is in grams per cubic centimeter, and the tungsten carbide grain size is in micrometers ($\mu$m). The balance of each one of the compositions is tungsten and carbon with most of the tungsten and carbon in the form of tungsten carbide.

In order to demonstrate the attributes of the invention, examples were prepared for testing and analysis. In regard to the processing of the examples, typical powder metallurgical techniques were used to prepare the green compacts. More specifically, the powder components were ball milled and then consolidated (e.g., pill pressing) into a partially dense so-called green compact for subsequent heat treatments. The green compacts are subsequently sintered and used as molded inserts or ground to size. In the examples set forth in this patent application fully sintered and ground cutting inserts (style SPG422) were heat treated; however, it should be appreciated that molded cutting inserts could have been heat treated in a similar fashion.

Table II herein sets forth the steps which comprised each one of the heat treatments wherein "T" represents the temperature in ° C., "P" represents the pressure in Torr, and "t" represents the time of duration in hours. More specifically, Process No. 1 and Process No. 2 comprise three steps each, and Process No. 3 comprises four steps. Generally speaking, in each one of these processes it is believed that the formation of eta phase occurs when the cutting insert substrate reaches a temperature of about 800° C. so that one can say that eta phase occurs at the low temperature oxidation of the substrate. Eta phase means a double carbide phase which is due to a deficiency in carbon. See pages 951–952 of Santhanam et al., "Cemented Carbides," *Metals Handbook*, Vol. 2, 10th Edition (1990), pages 951–977. Eta phase is shown by the article by Uhrenius, B., entitled "Phase diagrams as a tool for production and development of cemented carbides and steels," *Powder Metallurgy*, (1992), Vol. 35, No. 3, pages 203–210, including FIGS. 2*a* and 2*b* for the Co—W—C. system. The Santhanam et al. article and the Uhrenius article are hereby incorporated by reference herein. Eta phase includes $W_3Co_3C$, $W_6Co_6C$, $W_2Co_4C$ and $W_3Co_9C$. Then, as the cutting insert substrate with eta phase at the surface reaches a temperature in the range of between 1250° C. and 2000° C., the eta phase converts to fibrous tungsten carbide grains. The cobalt which exists due to the conversion of the eta phase most likely evaporates from the substrate, but there is a likelihood that some of the cobalt will combine with tungsten and carbon to form eta phase. Because of the difference in volume between the eta phase and the fibrous tungsten carbide grains, the conversion of the eta phase to the fibrous tungsten carbide grains provides for the substrate surface roughness that enhances the adhesion of the diamond coating to the substrate.

TABLE II

Steps of the Heat Treatments

| Process No./ Parameters | Process No. 1 | Process No. 2 | Process No. 3 |
|---|---|---|---|
| $T_1$ [° C.] | — | — | 500 |
| $P_1$ [torr] | — | — | vacuum |
| $t_1$ [hours] | — | — | 1.0 |
| $T_2$ [° C.] | 150 | 150 | 150 |
| $P_2$ [torr] | vacuum | vacuum | 0.5 torr nitrogen |
| $t_2$ [hours] | 2.0 | 2.0 | 2.0 |
| $T_3$ [° C.] | 1450 | 1310 | 1310 |
| $P_3$ [torr] | vacuum | vacuum | 0.5 torr nitrogen |
| $t_3$ [hours] | 1.0 | 2.0 | 2.0 |
| $T_4$ [° C.] | 1450 | 1310 | 1310 |
| $P_4$ [torr] | vacuum | vacuum | vacuum |
| $t_4$ [hours] | 2.0 | 3.0 | 4.0 |

Although the above three processes each provides for the formation of eta phase and the subsequent conversion of the eta phase to fibrous tungsten carbide grains, applicants contemplate the invention to include a process (and the resultant product) wherein the substrate with eta phase already at the surface is heat treated (e.g., sintered in vacuum) at a temperature in the range of between about 1250° C. and about 2000° C. in vacuum so as to convert the eta phase to fibrous tungsten carbide grains with the cobalt from the conversion of the eta phase most likely being evaporated from the surface of the substrate. One example of such a process comprises a substrate that has been subjected to an atmosphere of hydrogen and carbon dioxide at about 1000° C. so as to form eta phase on the surface. Another example of such a process comprises a substrate processed according to the disclosure of U.S. Pat. No. 5,585,176 to Grab et al. which is then surface oxidized so as to produce eta phase at the surface. Still another example of such a process comprises a substrate which is decarburized at the surface so that when heated above 800° C. it will form eta phase at the surface.

Table III sets forth the composition and processing procedure for each one of the Examples Nos. 1 through 6 which were subjected to the cutting tests.

TABLE III

Composition and Processing for Example Nos. 1–6

| Example No. | Composition No. | Processing Procedure (i.e., Process No.) |
|---|---|---|
| 1 | 1 | 1 |
| 2 | 1 | 2 |
| 3 | 1 | 1 |
| 4 | 1 | 2 |
| 5 | 2 | 3 |
| 6 | 1 | 3 |

All of the Examples Nos. 1 through 6 were coated with a diamond coating. In regard to Examples Nos. 1 and 2, the process was according to a CVD (chemical vapor deposition) hot filament technique in a mixture of 1% methane and 99% hydrogen, at 10 torr total gas pressure, and at a substrate temperature of between about 775° C. to 850° C. Other techniques such as DC plasma jet or microwave plasma are also suitable techniques for the deposition of the diamond coating. In the coating process, it is preferred that the temperature of the substrate during the coating operation be maintained between about 700° C. and about 875° C., and more preferable that the substrate temperature range between 750° C. and 850° C. In regard to Examples Nos. 3 through 6, the substrates were coated by an arc jet process which typically occurs at a substrate temperature range of between about 700° C. and about 1000° C.

Table IV herein sets for the cutting test results for examples of the invention (i.e., Examples Nos. 1–6) as compared to conventional cutting inserts with a diamond coating. In regard to the cutting conditions, the cutting insert was a SPG422 style of cutting insert with a 15° lead angle, the speed was 2500 surface feet per minute (sfm) [762 surface meters per minute], the feed was 0.005 inches per revolution (ipr) [0.127 millimeters per revolution], the depth of cut was 0.025 inches [0.635 millimeters], and the cutting insert and workpiece were flooded with coolant. The workpiece material was an aluminum silicon alloy grade designated as A390 Aluminum with a nominal 17% silicon by weight.

The conventional cutting inserts are shown by the designations Convent. 1 through Convent. 4. The first conventional cutting insert (i.e., Convent. 1) was a commercial PCD cutting insert sold by Kennametal Inc. of Latrobe, Pennsylvania USA under the designation KD100. The second, third and fourth conventional cutting inserts, i.e., Convent. 2 through Convent. 4, were commercial diamond coated cutting inserts sold by Kennametal Inc. under the designation KCD25 and prepared in the same diamond coating heat as Example Nos. 1 and 2. The Kennametal KCD25 cutting inserts were made according to the disclosure of U.S. Pat. No. 5,585,176 to Grab et al. entitled DIAMOND COATED TOOLS AND WEAR PARTS (which is hereby incorporated by reference herein).

TABLE IV

Results of Cutting Tests of Aluminum Silicon Alloy A390

| Example/ Properties & Results | Surface Roughness ($R_a$) [micro-inches] | Weight of Diamond Coating (mg) | Average Thickness of Diamond Coating ($\mu$m) | Tool Life (minutes) | Range of Workpiece Surface Roughness ($R_a$) [$\mu$-inches] | Comments About Mode of Tool Failure |
|---|---|---|---|---|---|---|
| 1 [HF 086 RT01 19 A] | 75 | 25.98 | 37.0 | 18.23 | 56–106 | AW SE at 20 min. |
| 2 [HF 086 RT25 23 E] | 18 | 24.08 | 36.1 | 16.13 | 32–83 | AW SE at 18 min. |
| 3 [arc jet RT07 19 A] | 70 | — | 17.1 | 4.00 | 39–61 | AW SE at 2 min. |
| 4 [arc jet RT21 23 E] | 20 | — | 18.4 | 8.00 | 31–77 | AW SE at 4 min. |
| 5 [arc jet GW31 26 H] | 42 | — | 14–20 | 4.00 | 38–100 | AW SE at 4 min. |
| 6 [arc jet RT32 26 H] | 12 | — | 14–20 | 4.00 | 38–51 | AW (0.0073 inches) SE at 4 min. |
| Convent. 1 [KD100] | NA | NA | NA | 20.00 | 30–66 | AW |
| Convent. 2 [HF 086 FQ65] | >42 | 20.7 | 33.8 | 14.00 | 43–97 | AW SE at 20 min. |
| Convent. 3 [HF 086 FQ62] | >42 | 25.9 | 36.0 | 10.91 | 35–68 | AW |
| Convent. 4 [HF 086 FQ659] | >42 | 39.2 | 47.8 | 19.33 | 43–49 | AW SE at 24 min. |

In Table IV the surface roughness, $R_a$, of the coated cutting insert is given in microinches ($\mu$-inches), the weight of the diamond coating deposited on the cutting insert is given in milligrams (mg), and the average thickness of the diamond coating is given in micrometers ($\mu$m). The tool life represents the amount of time it took to develop 0.010 inch maximum flank wear. The range of the surface roughness for the workpiece after cutting is given in microinches. In the Comments in Table IV, the designation "AW" means that the diamond coating wore by abrasive wear, and the designation "SE" refers to the amount of time (in minutes) it took to wear through the diamond coating and expose the substrate.

Referring to the results set forth in Table IV above, all of the diamond coated cutting inserts with surface eta phase failed by abrasive wear with no flaking detected through optical microscopy at 20× magnification. The wear rates of the diamond coated cutting inserts with surface eta phase are in accordance with known correlation between thickness and performance wherein this correlation is the result of the inventors' experience with metal cutting tests on A390 aluminum in the Kennametal Metal Cutting Laboratory. Examples Nos. 1 and 2 with diamond coating thickness of 30 $\mu$m or greater had wear resistances comparable to the Kennametal KCD25 cutting insert. Examples Nos. 1 and 2 also had wear resistances of at least 80% of that of the Kennametal KD100 PCD cutting insert. Examples Nos. 3 through 6 had abrasive wear in accordance with the known correlation between diamond coating thickness and performance. In this regard, the average thickness of the diamond coating of Examples Nos. 3 through 6 ranged between 14 $\mu$m and 20 $\mu$m. These thicknesses were less than the average thickness of the conventional cutting inserts which ranged between about 33 $\mu$m and about 48 $\mu$m.

A milling test with a single tooth flycutter was performed with the inserts at 3500 sfm [1066.8 surface meters per minute], 0.004 ipt [0.0102 centimeters per tooth], and 0.040 inch [0.1016 centimeters] DOC. The workpiece materials were 383.2 aluminum silicon alloy with 11% silicon and A390 aluminum silicon alloy with 17% silicon. Some properties of the cutting inserts and the test results are set forth in Table V below.

In Table V above, the surface roughness, $R_a$, of the coated cutting insert is given in microinches ($\mu$-inches), the weight of the diamond coating deposited on the cutting insert is given in milligrams (mg), and the average thickness of the diamond coating is given in micrometers. The tool life represents the amount of time it took to develop 0.010 inch maximum flank wear. The range of the surface roughness for the workpiece after cutting in given in microinches. In regard to the results of the milling of the 383.2 aluminum silicon alloy, three sets of four passes were performed to check for flaking of the coating because wear patterns took a long time to develop in the 383.2 aluminum silicon alloy. In regard to the results of the milling of the A390 alloy, the failure criterion in the A390 aluminum silicon alloy was severe flaking of the coating or the number of passes for a 0.010 inch wearland to develop. In Table V, the designation "NT" means not tested, the designation "NM" means not measured, the designation "NF" means no flaking, the designation "FL" means flaking.

Only Examples Nos. 5 and 6 flaked in the milling of the 383.2 aluminum silicon alloy. Example No. 6 flaked due to a surface roughness that was much too low for milling or severe interrupted cutting according to U.S. Pat. No. 5,585, 176 at Col. 9, lines 40 through 42 and the inventors' experience with interrupted cutting tests on A390 aluminum and 383.2 aluminum in the Kennametal Metal Cutting Laboratory. Example No. 5 showed localized flaking; however, this flaking did not prevent testing this cutting insert in the milling of the A390 aluminum silicon alloy. In the milling of the A390 aluminum silicon alloy, only the Kennametal diamond coated insert with coating thickness of 30 $\mu$m or greater and surface roughness greater than or equal

TABLE V

Results of Milling Tests

| Example No./ Properties & Results | Surface Roughness ($R_a$ $\mu$-inches) | Diamond Coating Weight (mg) | Average Diamond Coating Thickness (microns) | Results of Milling of the 383.2 Alloy | Results of Milling of the A390 Alloy (number of passes to failure) | Comments about the Test |
|---|---|---|---|---|---|---|
| Convent. 1 | NM | NM | NM |  | 31.00 | 0.0073 inch wearland after 31.00 passes |
| Convent. 2 | >42 | 20.7 | 33.8 | NF | 17.00 | — |
| 1 | 75 | 26.0 | 37.0 | NF | 17.00 | — |
| 2 | 18 | 24.1 | 36.1 | NF | FL | 4 passes in A390 generated flaking |
| 3 | 70 | 9.5 | 17.1 | NF | FL | 2 passes in A390 generated flaking |
| 4 | 20 | 10.3 | 18.4 | NF | FL | 1 pass in A390 generated flaking |
| 5 | 42 | 9.5 | NM | FL | FL | 1 pass in A390 generated flaking |
| 6 | 12 | 10.2 | NM | FL | NT | — | to 40 microinches $R_a$ performed equally or better than the Kennametal KCD25 cutting insert. This performance is in agreement with known correlation for milling A390 aluminum silicon alloy as set forth in U.S. Pat. No. 5,585,176 at Columns 9 and 10 and the inventors' experience with interrupted cutting tests on A390 aluminum and 383.2 aluminum in the Kennametal Metal Cutting Laboratory.

Table VI below sets forth the features of each one of FIGS. 3 through 29.

TABLE VI

Features of FIGS. 3–29

| FIG. | Nature of FIG. | Composition (No.) & Process (No.) | Coating (Technique) | Relation (if any) to Examples of Table III | Comments on Presence of Eta Phase at Substrate Surface |
|---|---|---|---|---|---|
| 3 | XRD | Comp. 1 & Proc. 2 | hot filament | Ex. 2 | eta phase present |
| 4 | XRD | Comp. 1 & Proc. 2 | arc jet | Ex. 4 | eta phase present |
| 5 | XRD | Comp. 1 & Proc. 3 | arc jet | Ex. 6 | eta phase present |
| 6 | XRD | Comp. 1 & Proc. 2 | uncoated | None | eta phase present |
| 7 | XRD | Comp. 1 & Proc. 1 | uncoated | None | eta phase present |
| 8 | XRD | Comp. 1 & Proc. 1 | hot filament | Ex. 1 | eta phase present |
| 9 | XRD | Comp. 1 & Proc. 1 | arc jet | Ex. 3 | eta phase present |
| 10 | XRD | — | — | Convent. 2 | — |
| 11 | SEM of edge surface at 1000X | Comp. 2 & Proc. 2 | uncoated | None | eta phase present at the edge surface |
| 12 | SEM of edge surface at 5000X | Comp. 2 & Proc. 2 | uncoated | None | eta phase present at the edge surface |
| 13 | SEM of edge surface at 10,000X | Comp. 2 & Proc. 2 | uncoated | None | eta phase present at the edge surface |
| 14 | EDS of the edge surface | Comp. 2 & Proc. 2 | uncoated | None | eta phase present at the edge surface |
| 15 | SEM of center surface at 10,000X | Comp. 2 & Proc. 2 | uncoated | None | eta phase absent from the center surface |
| 16 | EDS of center surface | Comp. 2 & Proc. 2 | uncoated | None | eta phase absent from the center surface |
| 17 | SEM of edge surface at 5000X | Comp. 1 & Proc. 2 | uncoated | None | eta phase present at the edge surface |
| 18 | EDS at the edge surface | Comp. 1 & Proc. 2 | uncoated | None | eta phase present at the edge surface |
| 19 | SEM of edge surface at 7300X | Comp. 1 & Proc. 2 | uncoated | None | eta phase present at the edge surface |
| 20 | Spot EDS of edge surface (FIG. 19) | Comp. 1 & Proc. 2 | uncoated | None | eta phase present at the edge surface |
| 21 | Spot EDS of edge surface (FIG. 19) | Comp. 1 & Proc. 2 | uncoated | None | eta phase present at the edge surface |
| 22 | SEM of center surface at 5000X | Comp. 1 & Proc. 2 | uncoated | None | eta phase present at the center surface |
| 23 | EDS of the center surface | Comp. 1 & Proc. 2 | uncoated | None | eta phase present at the center surface |
| 24 | SEM of edge surface at 1000X | Comp. 1 & Proc 1 | uncoated | None | eta phase present at the edge surface |
| 25 | SEM of edge surface at 5000X | Comp. 1 & Proc. 1 | uncoated | None | eta phase present at the edge surface |
| 26 | EDS of edge surface | Comp. 1 & Proc. 1 | uncoated | None | eta phase present at the edge surface |

TABLE VI-continued

Features of FIGS. 3–29

| FIG. | Nature of FIG. | Composition (No.) & Process (No.) | Coating (Technique) | Relation (if any) to Examples of Table III | Comments on Presence of Eta Phase at Substrate Surface |
|---|---|---|---|---|---|
| 27 | SEM of center surface at 1000X | Comp. 1 & Proc. 1 | uncoated | None | eta phase present at the center surface |
| 28 | SEM of center surface at 5000X | Comp. 1 & Proc. 1 | uncoated | None | eta phase present at the center surface |
| 29 | EDS of center surface | Comp. 1 & Proc. 1 | uncoated | None | eta phase present at the center surface |

Now referring to FIGS. 3 through 9, overall, the XRD analyses presented in FIGS. 3–9 show that eta phase existed on the surface of the substrates (of Compoition No. 1 with 2.3–2.9 wt. % cobalt) after the heat treatment pursuant to any one of Processes Nos. 1–3 and before the application of the diamond coating. Eta phase was also present after the application of the diamond coating. The presence of eta phase after the application of the diamond coating show that the application of the diamond coating did not decompose the eta phase. The presence of eta phase after the application of the diamond coating also shows that the cobalt in the eta phase did not react with the diamond. As is known in the art, the reaction of cobalt with diamond is an undesirable occurrence. The results set forth in FIGS. 3 through 9 are discussed in detail hereinafter.

Figure 3:
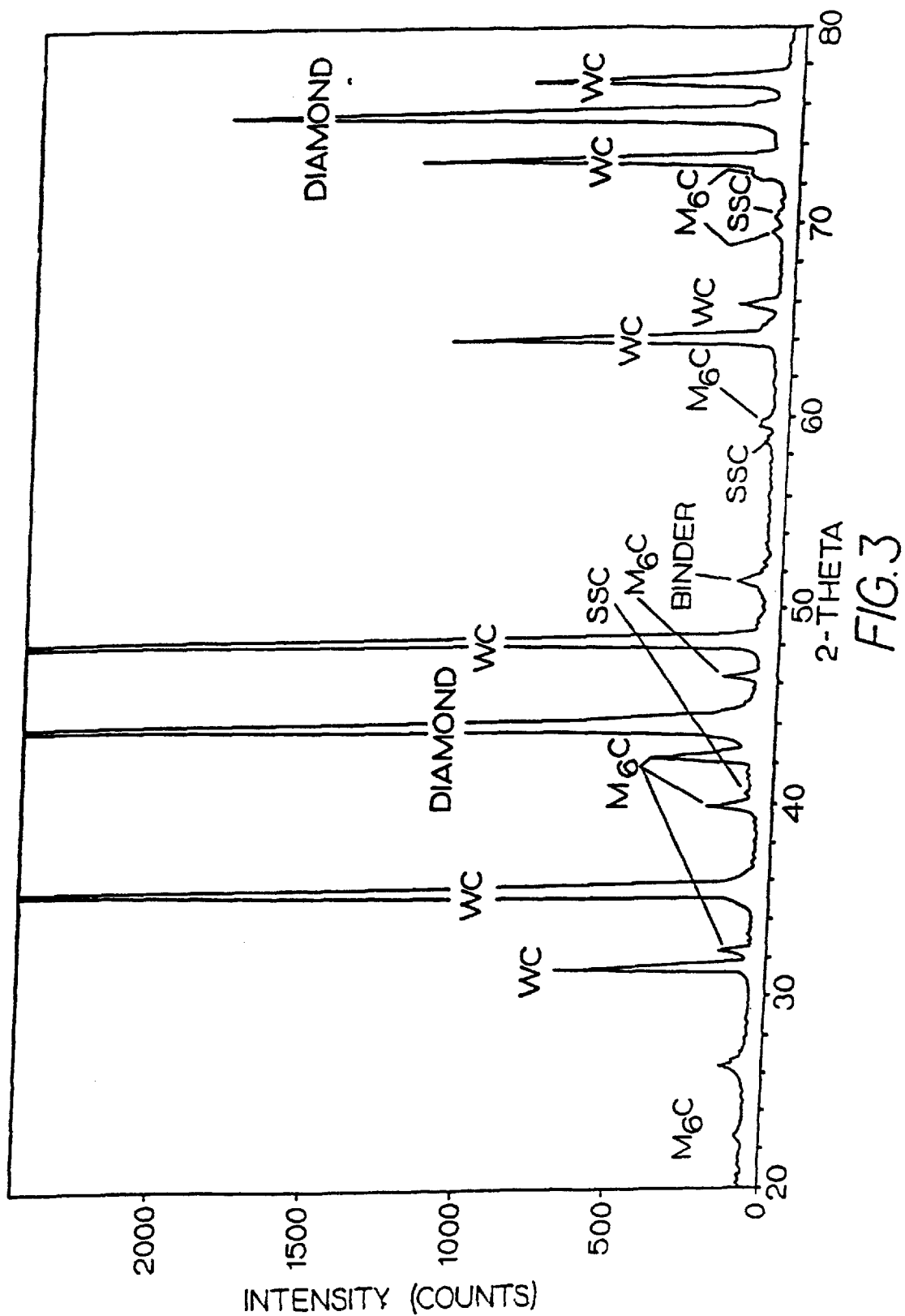
FIG. 3 is an X-ray diffraction (XRD) pattern of the top face of a diamond coated cutting insert of Composition No. 1 of Table I which was processed according to Process No. 2 of Table II and diamond coated via the hot filament technique so as to be like Example No. 2 of Table IV and wherein the presence of eta phase ($Co_3W_3C$), diamond, tungsten carbide (WC) and solid solution carbide (SSC) are noted by the corresponding peaks [$M_6C$]

FIG. 3 reveals that eta phase was present on the top face of a diamond coated cutting insert of Composition No. 1 (see Table I) which was processed according to Process No. 2 (see Table II). This cutting insert was like Example No. 2 in Table IV.

Figure 4:
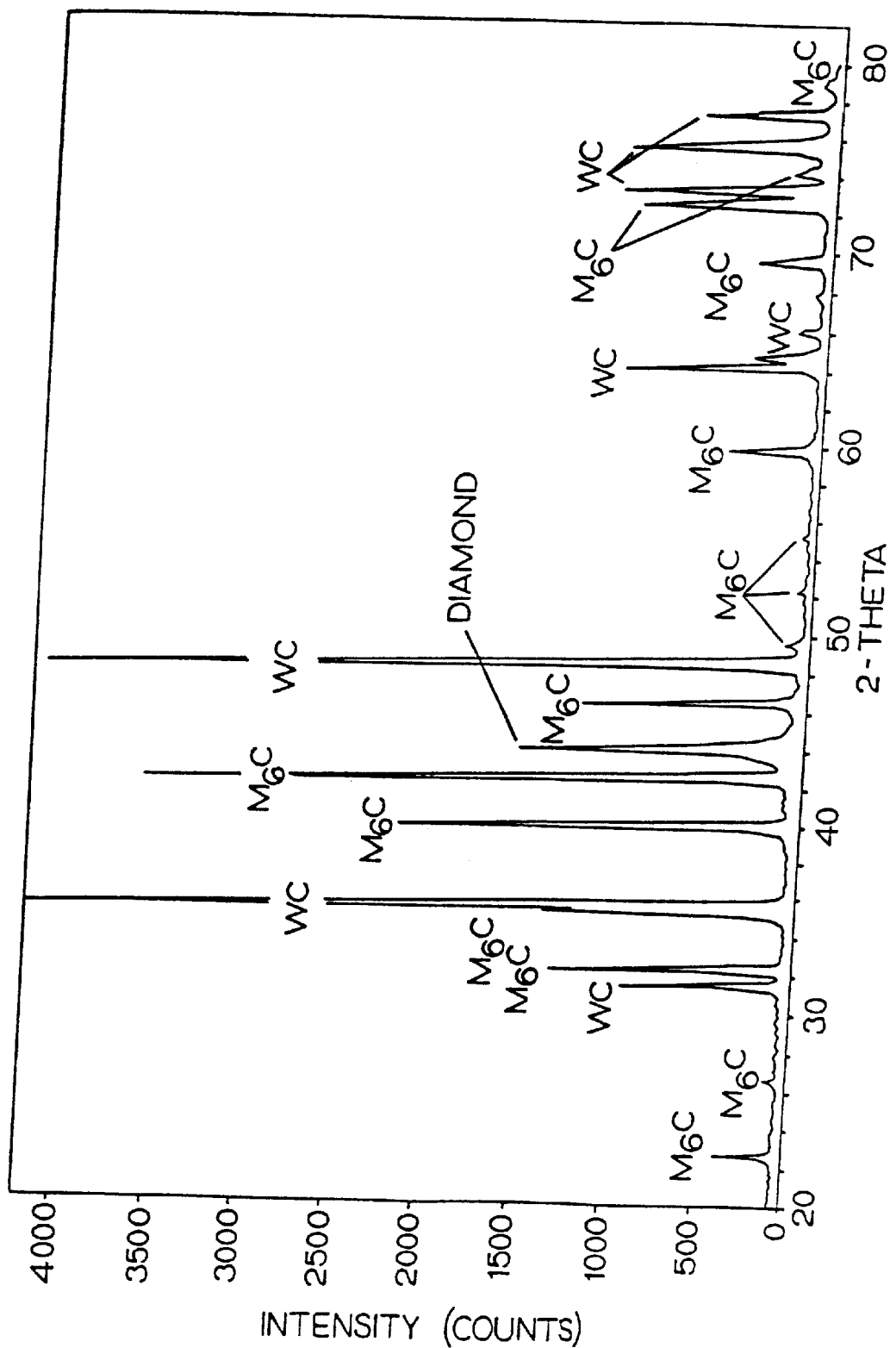
FIG. 4 is an X-ray diffraction pattern (XRD) of the top rake face of a diamond coated cutting insert of Composition No. 1 of Table I which was processed according to Process No. 2 of Table II and diamond coated via the arc jet technique so as to be like Example No. 4 in Table IV and wherein the presence of eta phase ($Co_3W_3C$) [M6C], tungsten carbide, solid solution carbide (SSC), and diamond are noted by their corresponding peaks.
Figure 5:
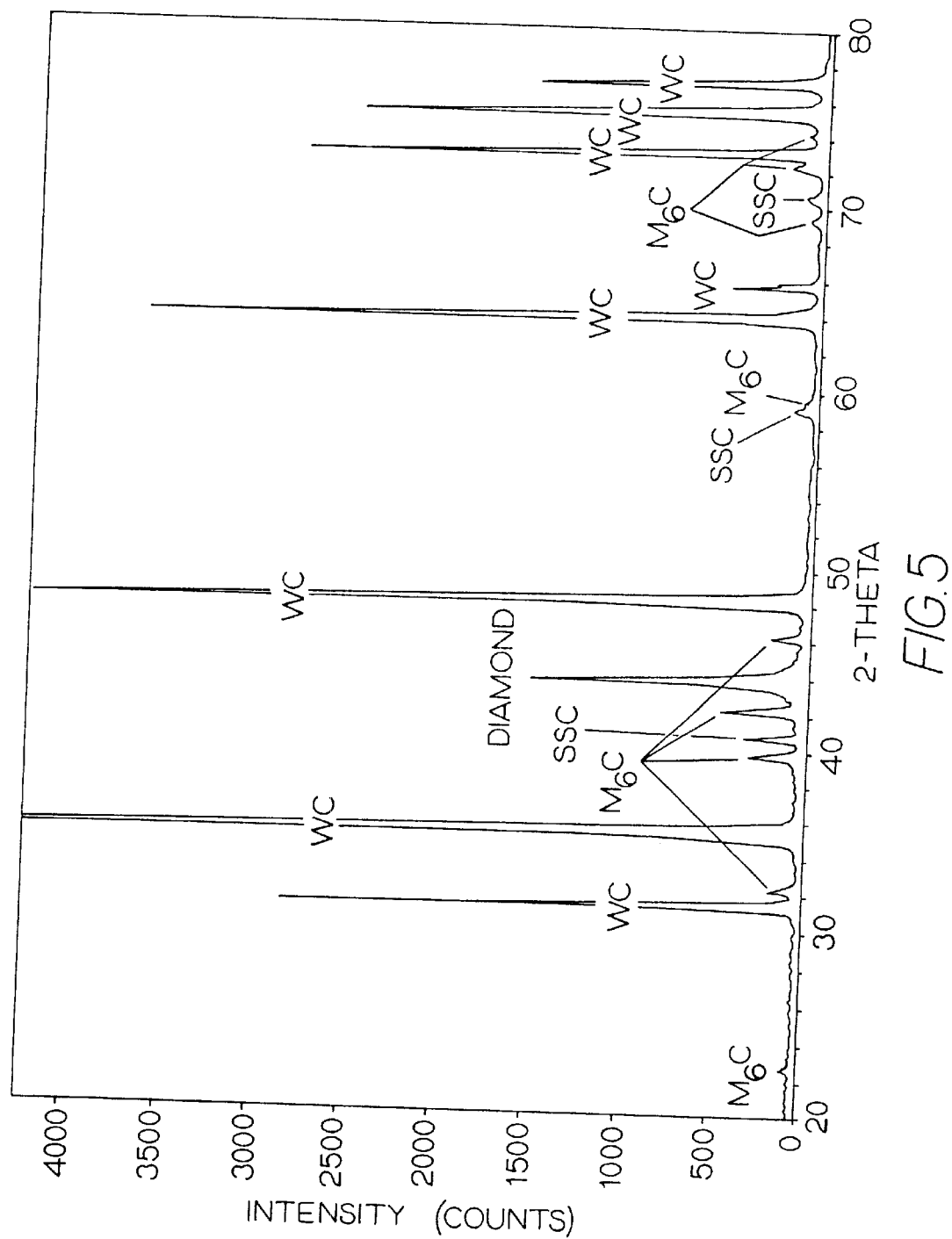
FIG. 5 is an X-ray diffraction (XRD) pattern of the top rake face of a diamond coated cutting insert of Composition No. 1 of Table I processed according to Process No. 3 of Table II and diamond coated via the arc jet technique so as to be like Example No. 6 of Table IV and wherein the presence of eta phase ($Co_3W_3C$) [M6C], tungsten carbide, solid solution carbide (SSC), and diamond are noted by their corresponding peaks.

FIG. 4 reveals that eta phase still existed at the surface of the substrate after the arc jet application of a diamond coating to the substrate of Composition No. 1 processed according to Process No. 2. This cutting insert of FIG. 4 was like Example No. 4 in Table IV. FIG. 5 reveals the same basic condition on the surface of this cutting insert as at the surface of the cutting insert of FIG. 4 in that eta phase existed on the substrate surface. The sample shown by FIG. 5 is a cutting insert of Composition No. 1 processed according to Process No. 3 after the arc jet application of a diamond coating to the substrate. This cutting insert of FIG. 5 is like Example No. 6 in Table IV.

Figure 6:
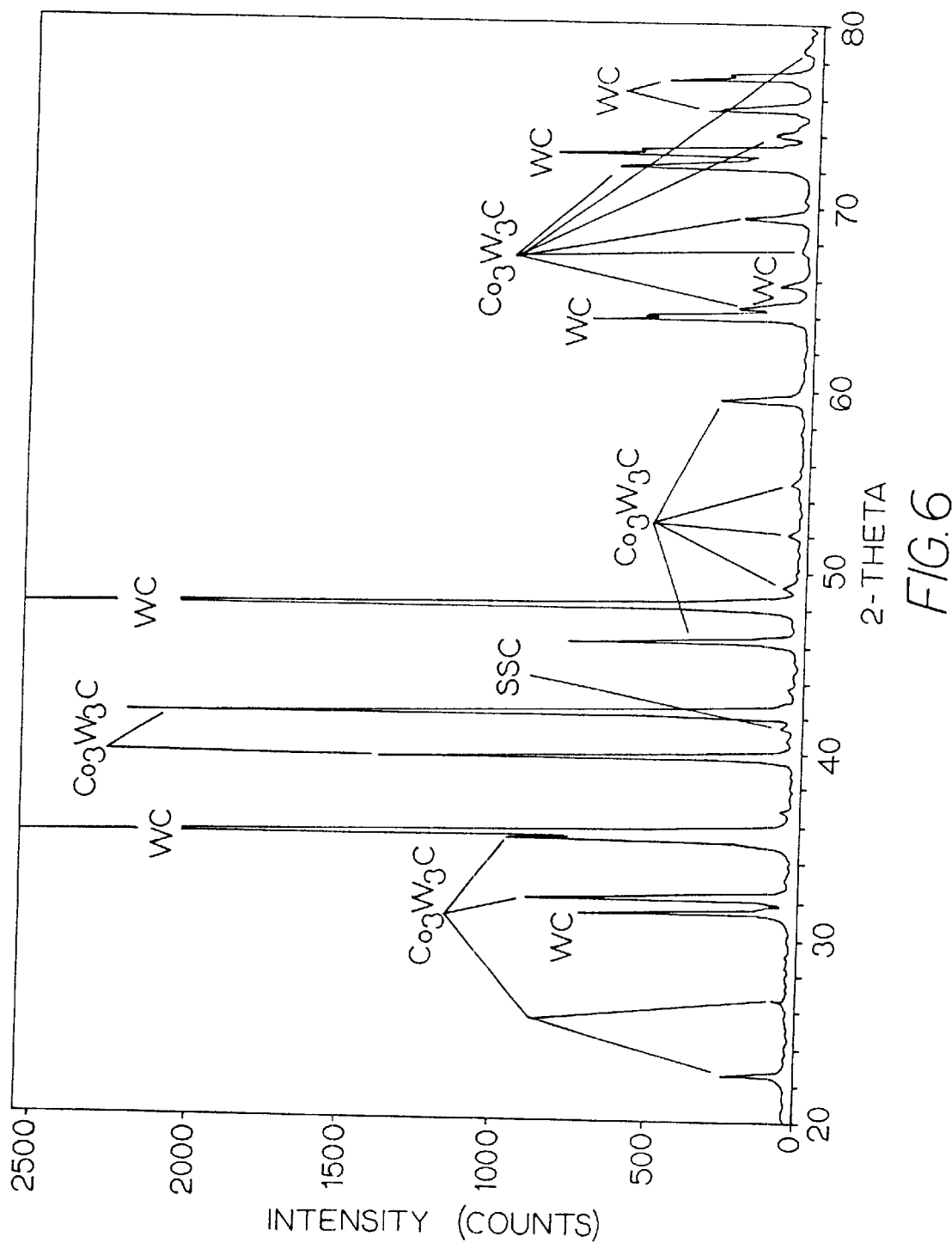
FIG. 6 is an X-ray diffraction pattern of the rake face of an uncoated substrate of the cobalt cemented tungsten carbide of Composition No. 1 of Table I which was processed according to Process No. 2 of Table II and wherein the presence of eta phase ($Co_3W_3C$), solid solution carbide (SSC), and tungsten carbide are noted by their corresponding peaks.

FIG. 6 reveals that eta phase existed at the surface before the application of a diamond coating to a substrate of Composition No. 1 which was processed according to Process No. 2. Diamond coated cutting inserts wherein the substrates were of Composition No. 1 processed according to Process No. 2 are the subject of FIG. 3 (hot filament technique) and FIG. 4 (arc jet technique). FIGS. 3 and 4 show that for each diamond application technique, eta phase existed at the surface of the substrate. It thus becomes apparent that the application of the diamond coating (via either the hot filament technique or the arc jet technique) did not decompose the eta phase at the surface. The presence of eta phase after the application of the diamond coating also reveals that the cobalt in the eta phase did not react with the diamond applied by either the hot filament technique or the arc jet technique.

Figure 7:
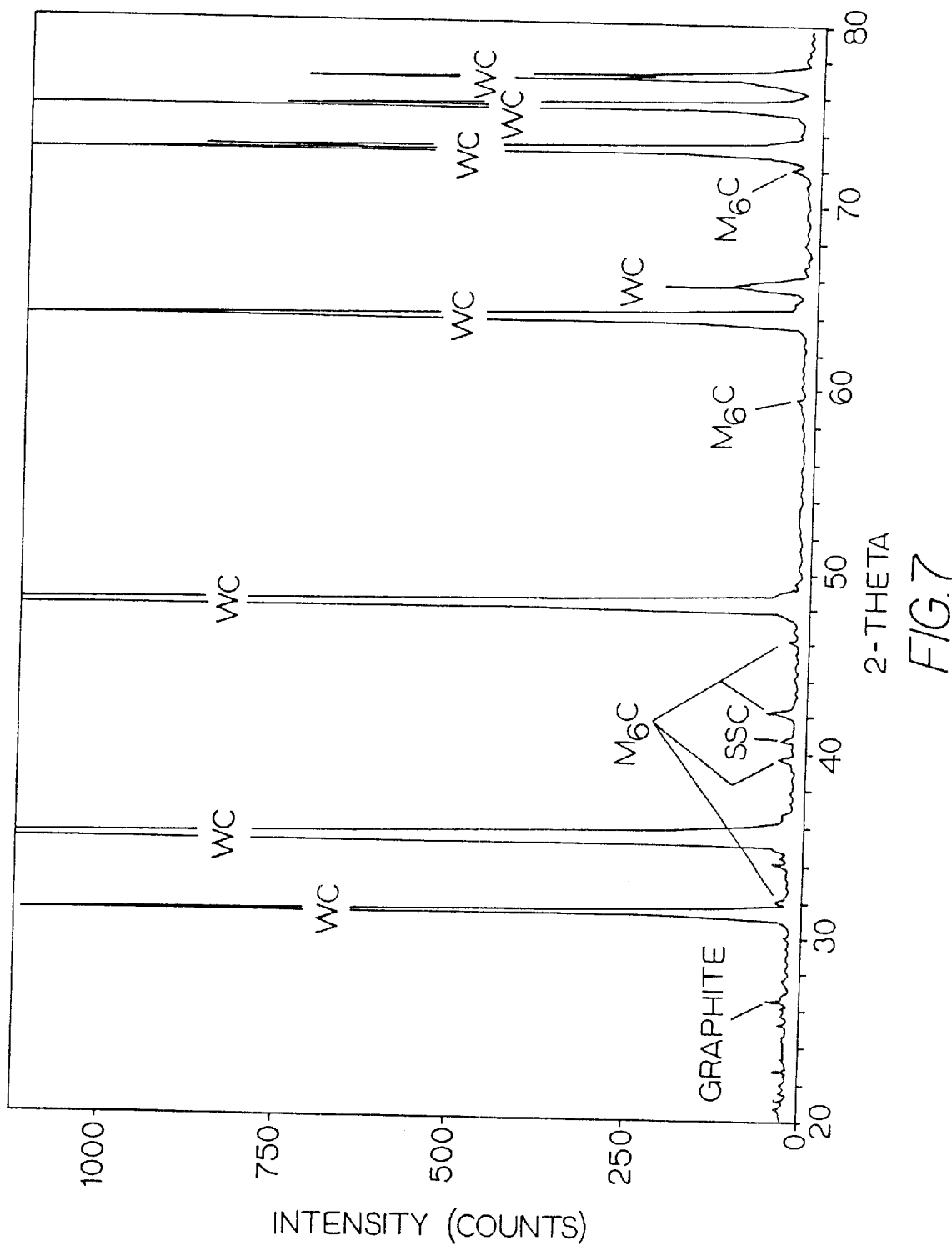
FIG. 7 is an X-ray diffraction pattern of an uncoated substrate of cobalt cemented tungsten carbide of Composition No. 1 of Table I which was processed according to Process No. 1 of Table II and wherein the presence of eta phase ($Co_3W_3C$) [$M_6C$], tungsten carbide, solid solution carbide (SSC), and a trace of graphite are noted by their corresponding peaks.
Figure 8:
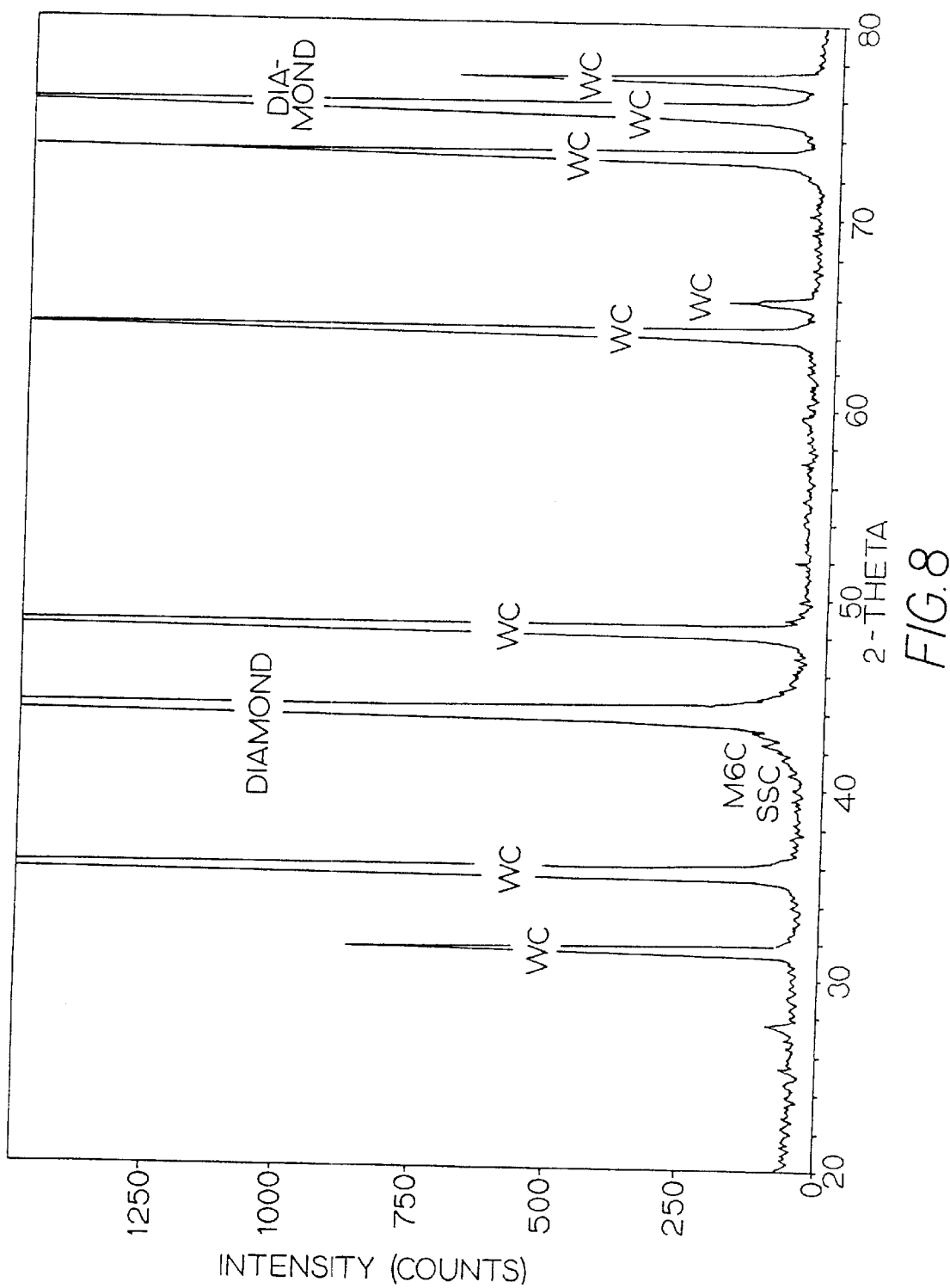
FIG. 8 is an X-ray diffraction pattern of a diamond coated cutting insert of Composition No. 1 of Table I processed according to Process No. 1 of Table II and diamond coated via the hot filament technique so as to be like Example No. 1 in Table IV and wherein the presence of eta phase (Co$_3$W$_3$C) [M$_6$C], tungsten carbide, solid solution carbide (SSC), and diamond are noted by their corresponding peaks.
Figure 9:
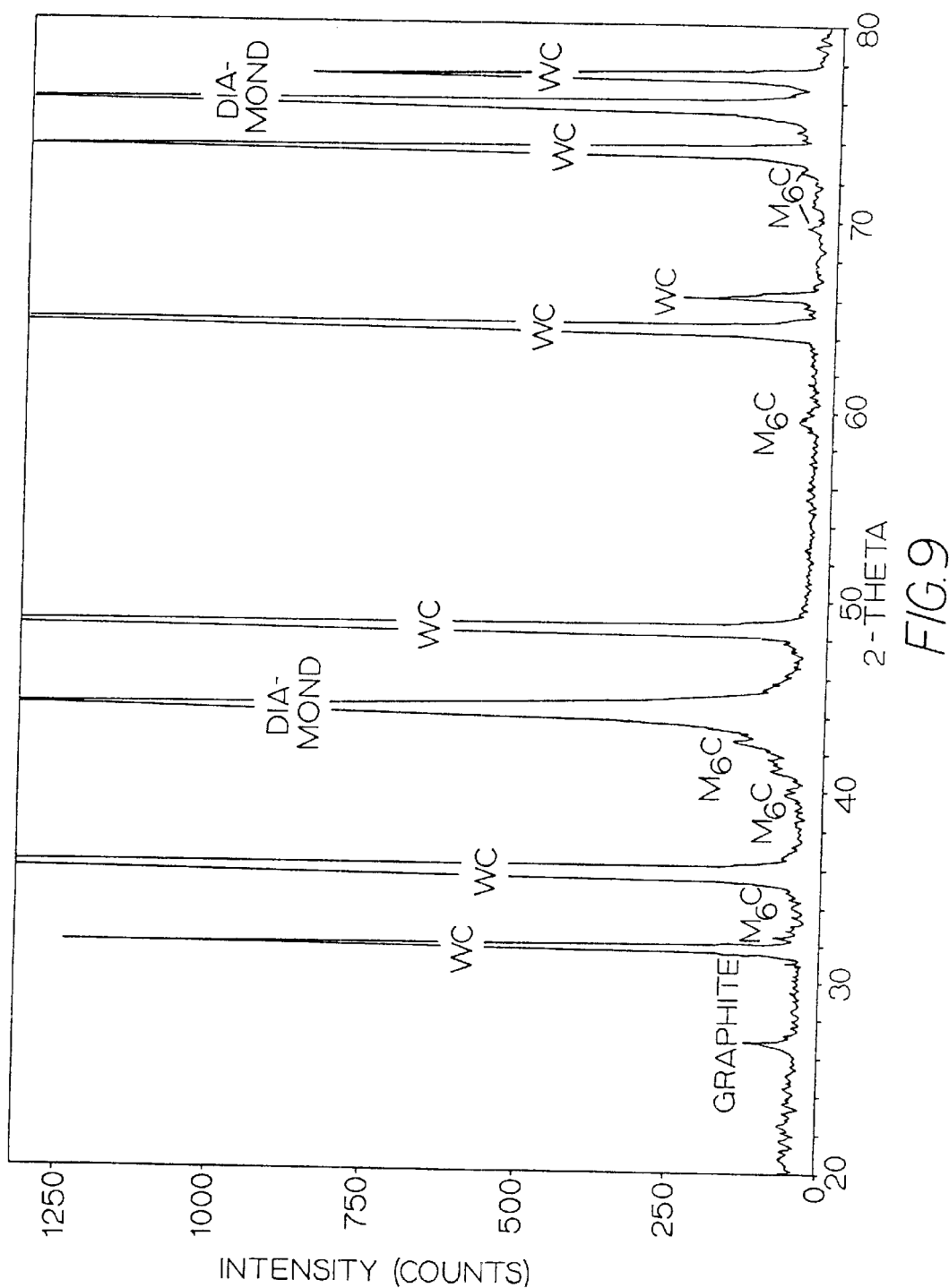
FIG. 9 is an X-ray diffraction pattern of a diamond coated cutting insert of Composition No. 1 of Table I processed according to Process No. 1 of Table II and diamond coated via the arc jet technique so as to be like Example No. 3 in Table IV and wherein the presence of eta phase (Co$_3$W$_3$C) [M$_6$C], tungsten carbide, a trace of graphite, and diamond are noted by their corresponding peaks.

FIG. 7 shows that eta phase existed at the surface of an uncoated substrate of Composition No. 1 which was processed according to Process No. 1. FIG. 8 reveals that eta phase was present on the top face of a sample of Composition No. 1 after the application of a diamond coating by the hot filament technique to the substrate processed according to Process No. 1. The diamond coated cutting insert of FIG. 8 is like Example No. 1 in Table IV. A slow scan of the XRD spectrum enhances the intensity of the eta phase peaks. FIG. 9 reveals that eta phase was present on the top face of a sample of Composition No. 1 after the application of a diamond coating by the arc jet method to the substrate processed according to Process No. 1. The diamond coated cutting insert of FIG. 9 is like Example No. 3 in Table IV. A comparison of the results set out in FIGS. 7 through 9 show that the application of a diamond coating, by either the hot filament technique or the arc jet method, did not decompose the eta phase. Such a comparison of FIGS. 7–9 also shows that the cobalt in the eta phase did not react with the diamond.

Figure 10:
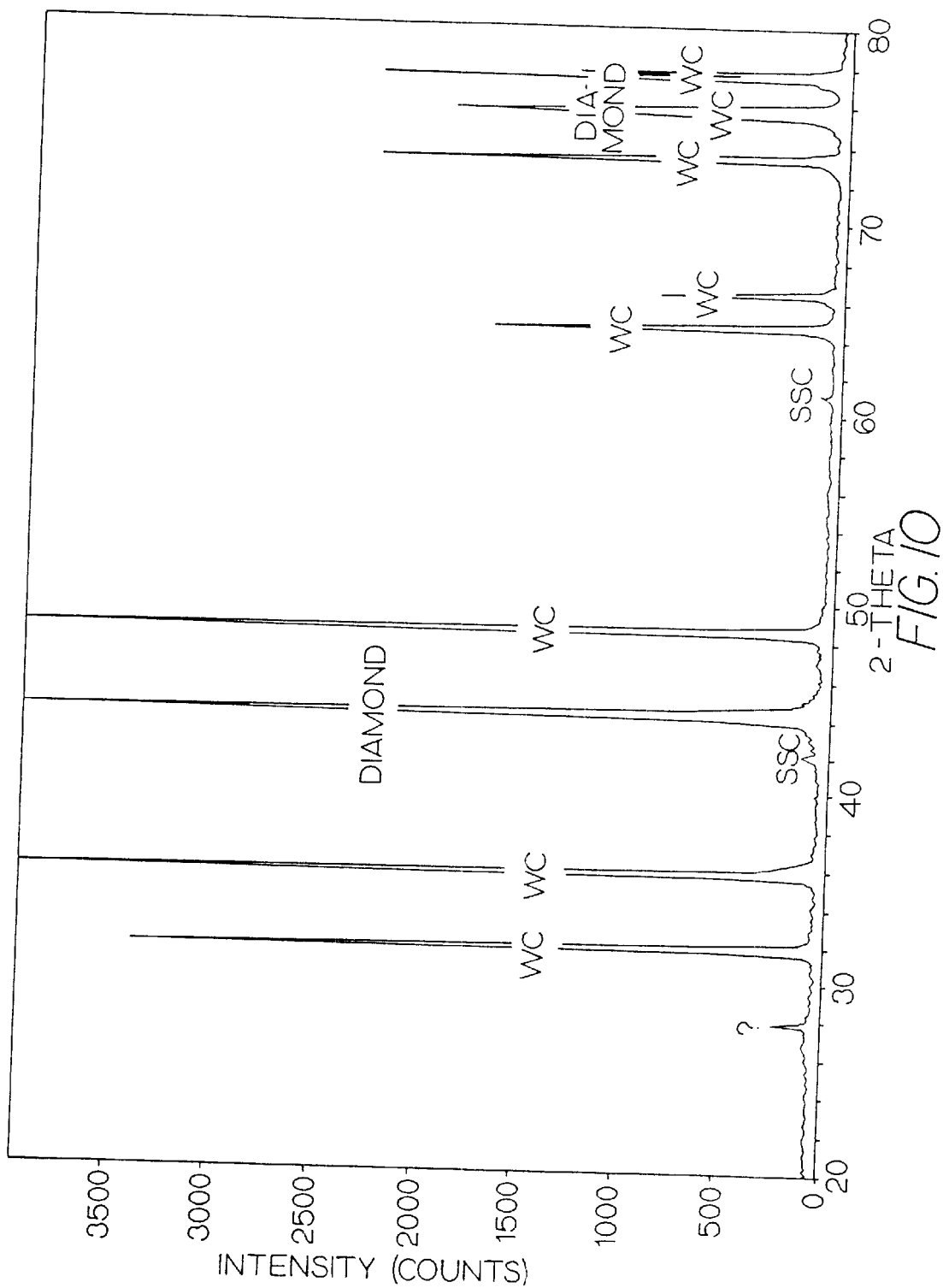
FIG. 10 is an X-ray diffraction pattern of a diamond coated cutting insert that is like Convent. No. 2 in Table IV and wherein the absence of eta phase is noted, as peaks due to solid solution carbide (SSC), tungsten carbide, and diamond are observed.

FIG. 10 shows the XRD spectrum of a diamond coated cutting insert prepared according to U.S. Pat. No. 5,585,176 to Grab et al. This cutting insert is like Convent. No. 2 in Table IV.

The results of SEM analysis and EDS analysis of a number of uncoated cutting insert substrates are set forth in FIGS. 11 through 29. A detailed discussion of the results presented by FIGS. 11–29 now follows.

Figure 11:
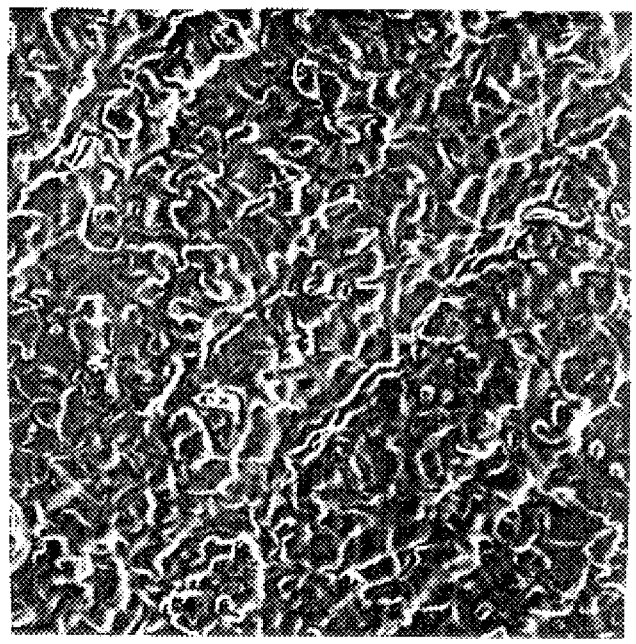
FIG. 11 is a scanning electron microscope (SEM) photomicrograph which depicts secondary electron images (SEI) at a magnification of 1000× of the edge of the uncoated substrate of a cutting insert of Composition No. 2 of Table I which was processed according to Process No. 2 of Table II.
Figure 12:
FIG. 12 is a scanning electron microscope (SEM) photomicrograph which depicts secondary electron images (SEI) at a magnification of 5000× of the edge of the uncoated substrate of the cutting insert of FIG. 11.
Figure 13:
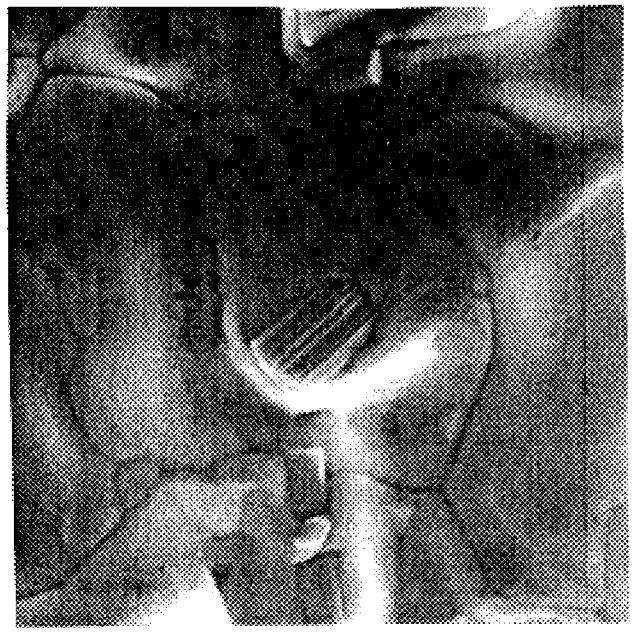
FIG. 13 is a scanning electron microscope (SEM) photomicrograph which depicts secondary electron images (SEI) at a magnification of 10,000× of the edge of the uncoated substrate of the cutting insert of FIG. 11.

FIGS. 11 through 13 are photomicrographs at different magnifications taken via scanning electron microscopy (SEM). These photomicrographs (FIGS. 11–13) show the surface of the edge of a substrate of Composition No. 2 processed according to Process No. 2. These photomicrographs show the presence of eta phase along the edge of the cutting insert. FIGS. 12 and 13 show the presence of fibrous tungsten carbide grains at the surface of the edge of the substrate. These fibrous tungsten carbide grains are the result of the partial conversion of the eta phase to tungsten carbide grains and the evaporation of cobalt, which was present from the conversion of the eta phase, during the heat treatment (i.e., sintering). Such fibrous tungsten carbide grain growth provides for an irregular surface due to a difference in the volume between the eta phase and the fibrous tungsten carbide grains. The presence of the irregular surface enhances the surface roughness of the substrate. Surface profilometer measurements along the edge gave a surface roughness of 45 microinches $R_a$, for the cutting insert of FIGS. 11–13.

Figure 14:
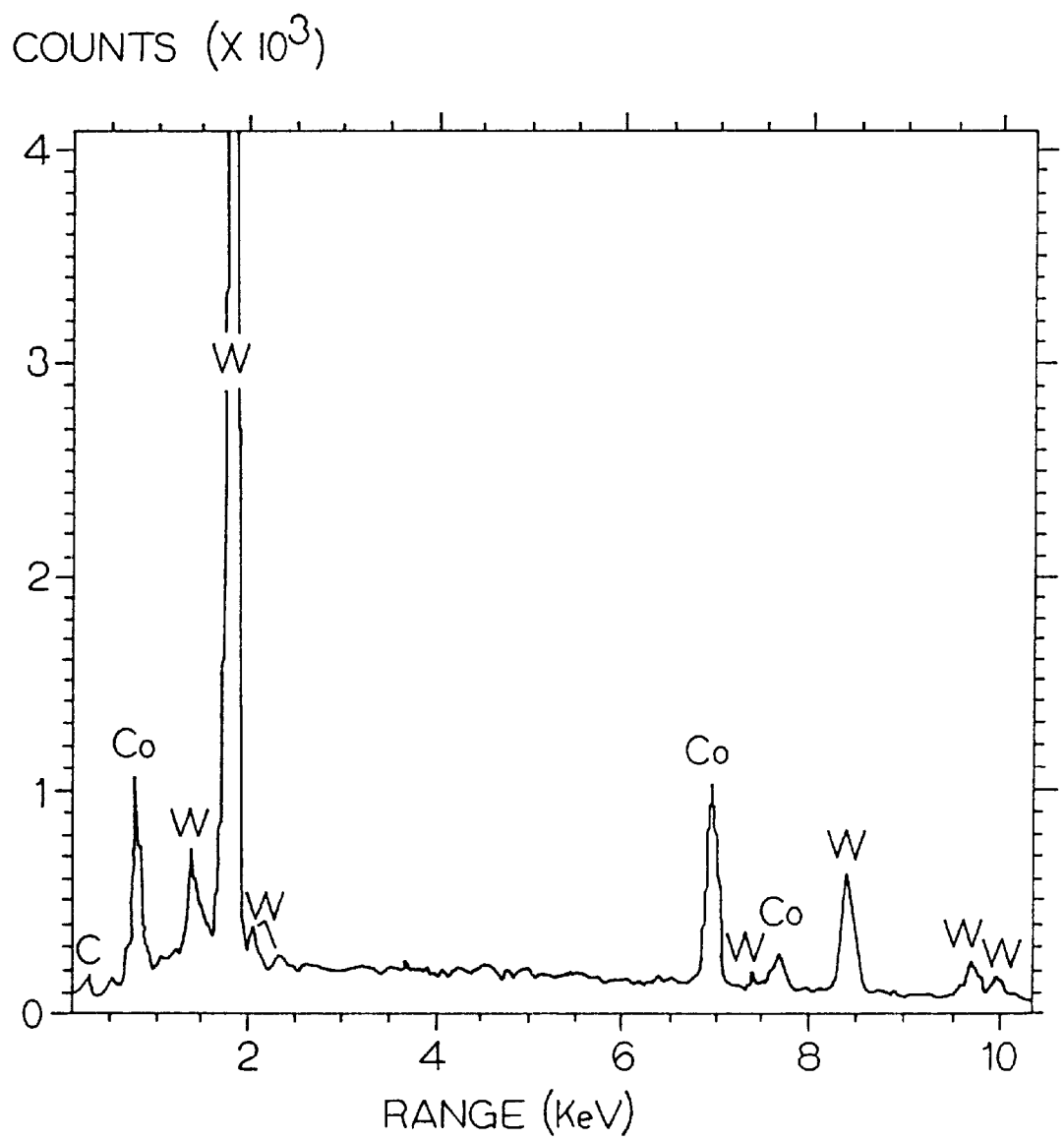
FIG. 14 is a graph which displays the results of a SEM energy dispersive line scan analysis (EDS) at a 1000× field of the surface of the cutting insert of FIG. 11 at its edge wherein the peaks represent tungsten (W), cobalt (Co), and carbon (C) where indicated.

FIG. 14 shows the results of an EDS analysis of the surface of the edge of the cutting insert substrate (Composition No. 2/Process No. 2) shown in FIGS. 11 through 13. It is typical in a cobalt cemented tungsten carbide that the cobalt is located at the interstices of the tungsten carbide grains. The EDS analysis in FIG. 14 reveals, however, that the surface at the edge of the insert was atypical of cobalt cemented tungsten carbide. Subsequent analysis of the edge and the corner areas of this cutting insert with Murakami's reagent, a standard laboratory practice for the detection of eta phase, showed there to be eta phase dune to the rapid etching of this phase in Murakami's reagent. It should be appreciated that the location of the eta phase at the corners and edges of the cutting insert prevented the focusing of the X-ray beam on these areas and prevented the identification of the eta phase type via the X-ray diffraction technique.

Figure 15:
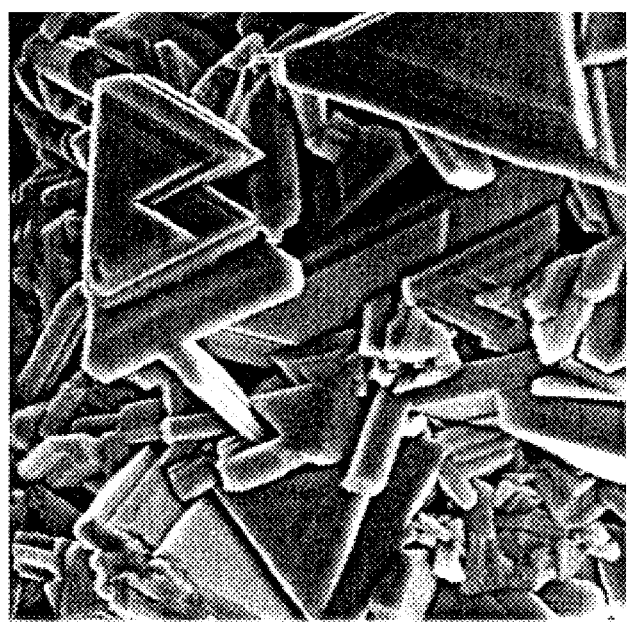
FIG. 15 is a scanning electron microscope (SEM) photomicrograph which depicts secondary electron images (SEI) at a magnification of 10,000× of the center of the uncoated substrate of the cutting insert of FIG. 11.
Figure 16:
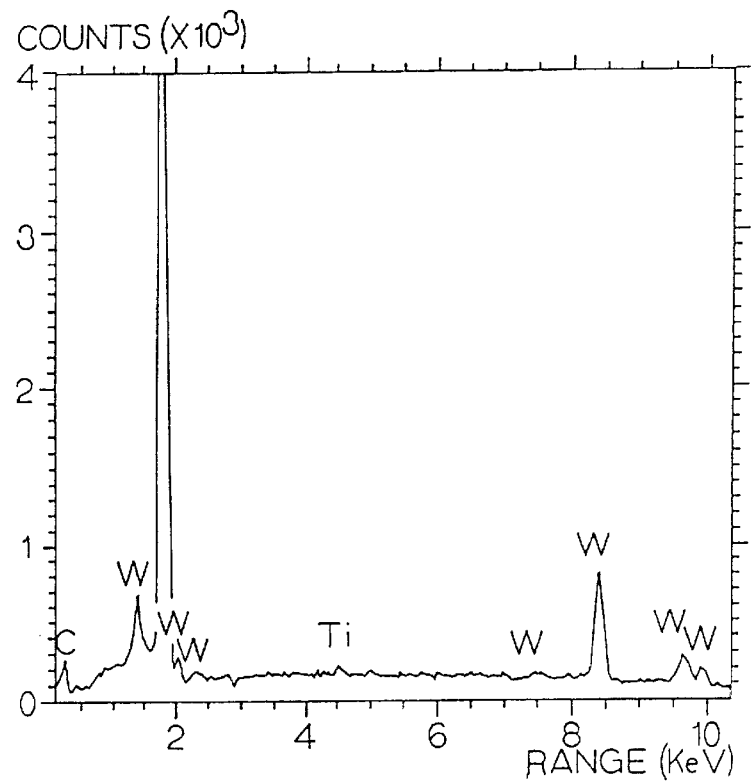
FIG. 16 is a graph which displays the results of a SEM energy dispersive line scan analysis (EDS) at a field of 1000× of the surface of the cutting insert of FIG. 11 at its center wherein the peaks represent tungsten (W) and titanium (Ti) where indicated.

FIG. 15 shows an SEM photomicrograph of the center of the cutting insert (Composition No. 2/Process No. 2) whose edges are shown in FIGS. 11 through 13. FIG. 16 is an EDS analysis of the surface of the same center area shown in FIG. 15. The photomicrograph of FIG. 15 and the EDS scan of FIG. 16 reveal that eta phase was absent from the surface of the center of the cutting insert substrate. Subsequent scans by SEM over the surface confirmed that eta phase was present only at the edges and corners of the cutting insert, and that eta phase was absent from the center of the cutting insert. The center of the cutting insert (Composition No. 2/Process No. 2) shown in FIG. 15 presents a microstructure like that of samples produced according to U.S. Pat. No. 5,585,176 to Grab et al.

Referring to the good adhesion properties of the diamond coating to a cutting insert substrate like that shown in FIGS. 11–16 (Composition No. 2/Process No. 2), there should be good adhesion of the diamond coating at the center of the cutting insert due to the surface roughness (even in the absence of eta phase) since the surface at the center is like that disclosed in U.S. Pat. No. 5,585,176 to Grab et al., which discusses the adhesion of a diamond coating due to surface roughness. There should be good adhesion of the diamond coating at the edges and corners of the cutting insert substrate due to the presence of the fibrous tungsten carbide grains which presented an acceptable surface roughness. It can thus be seen that there should be good adhesion of the diamond coating to the center, as well as the edges and corners, of the cutting insert substrate.

Figure 18:
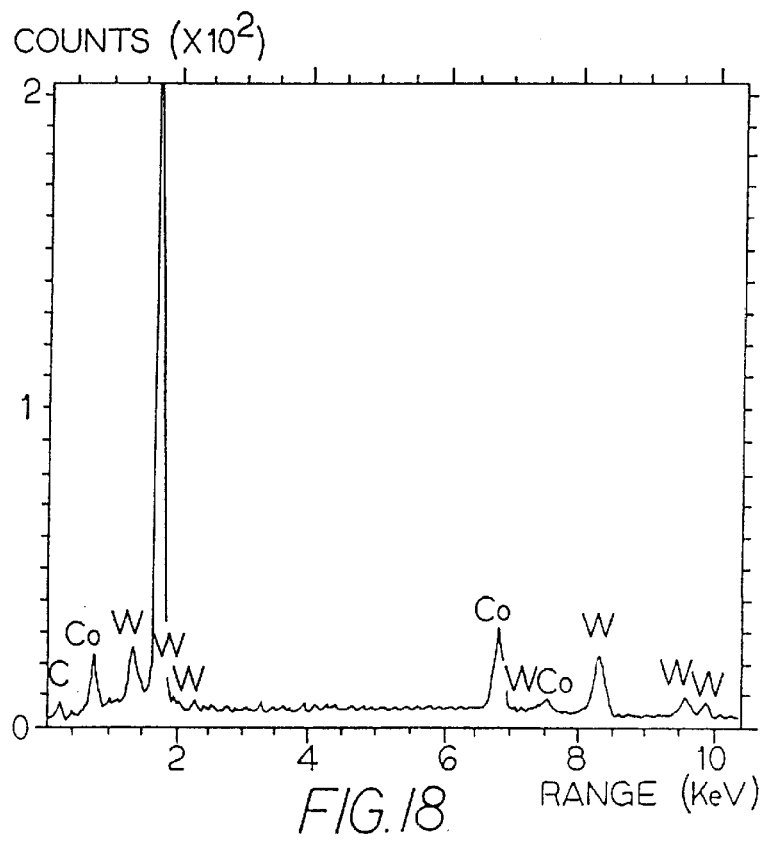
FIG. 18 is a graph which displays the results of a SEM energy dispersive line scan analysis (EDS) at a 1000× field of the cutting insert of FIG. 17 at its edge wherein the peaks represent tungsten (W) and cobalt (Co) where indicated.
Figure 17:
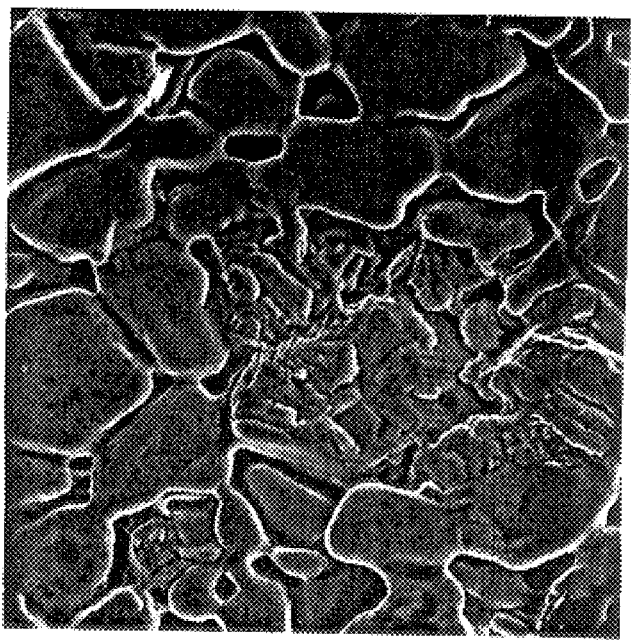
FIG. 17 is a scanning electron microscope (SEM) photomicrograph which depicts secondary electron images (SEI) at a magnification of 5000× of the edge of the uncoated substrate of a cutting insert of Composition No. 1 (Table I) processed according to Process No. 2 (Table II)
Figure 19:
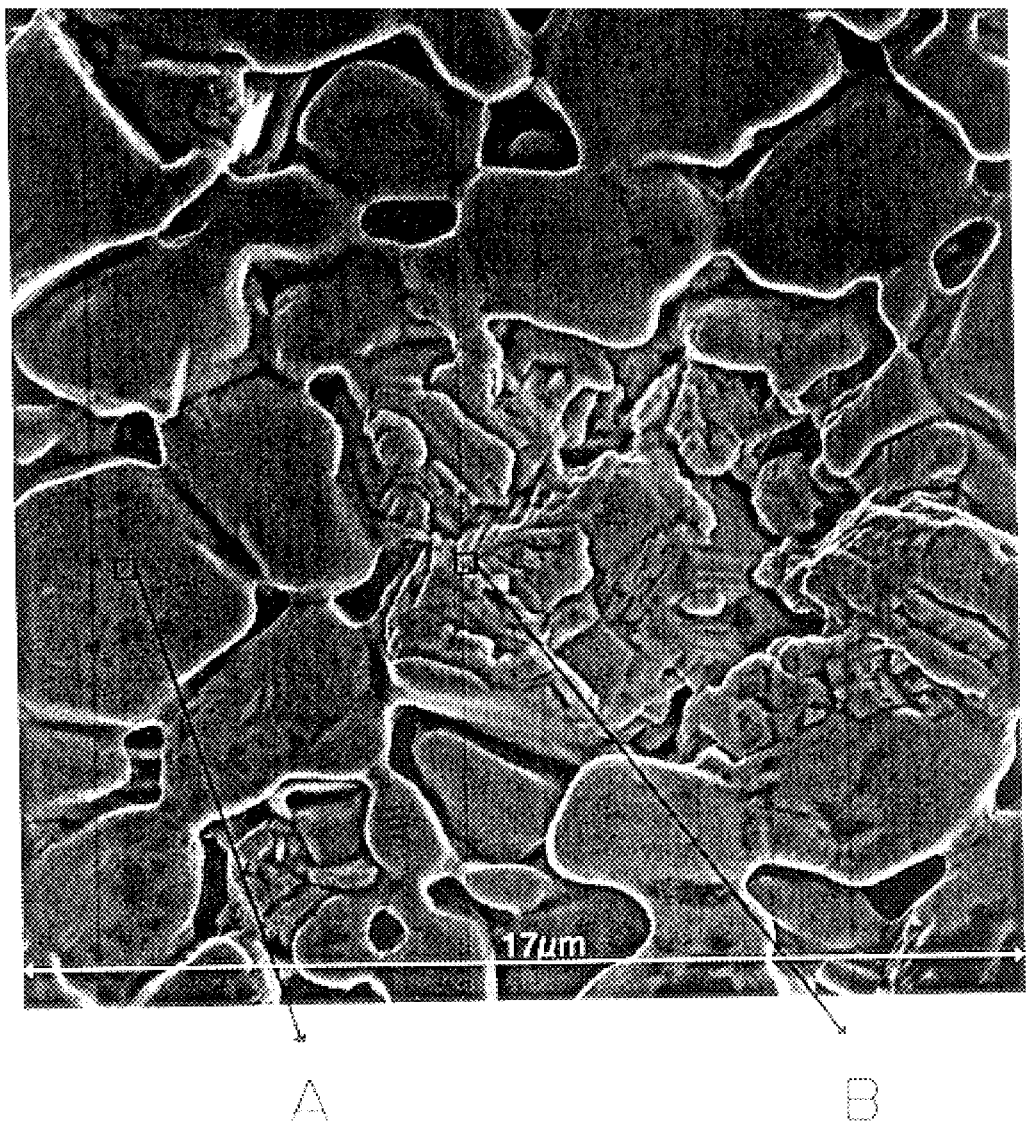
FIG. 19 is a scanning electron microscope (SEM) photomicrograph which depicts secondary electron images (SEI) at a magnification of 7300× of the edge of the cutting insert of FIG. 17 and wherein the box designated with Arrow A designates the location of the spot EDS analysis set forth in FIG. 20 hereof and the box designated with Arrow B designates the location of the spot EDS analysis set forth in FIG. 21 hereof.
Figure 20:
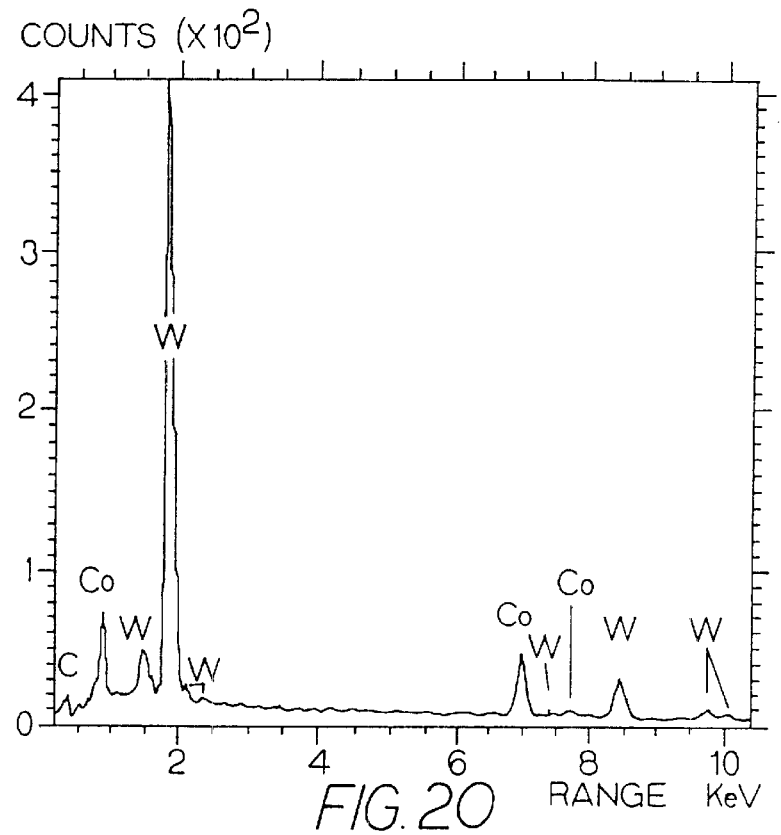
FIG. 20 is a graph which displays the results of a SEM energy dispersive line scan analysis (EDS) of the area encompassed by the box designated with Arrow A, wherein the peaks represent tungsten (W), cobalt (Co), and carbon (C) where indicated.
Figure 21:
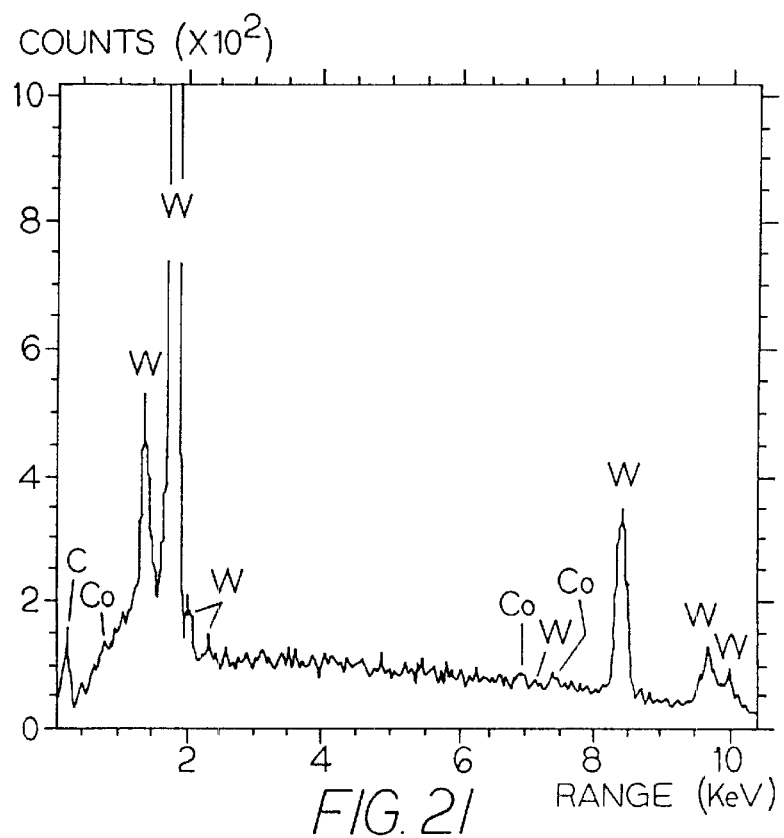
FIG. 21 is a graph which displays the results of a SEM energy dispersive line scan analysis (EDS) of the area encompassed by the box designated with Arrow B, wherein the peaks represent tungsten (W), cobalt (Co), and carbon (C) where indicated.

FIG. 17 shows an SEM photomicrograph at 5000× magnification of the surface of the edge of a cutting insert (Composition No. 1/Process No. 2). FIG. 18 shows an EDS spectrum of the same sample area as shown in FIG. 17, but at 1000× magnification. The EDS spectrum of FIG. 18 shows large peaks due to cobalt. FIG. 19 shows an SEM photomicrograph at 7300× magnification of the same area shown in FIG. 17. In FIG. 19 the box which corresponds with Arrow A shows the location (i.e., the area defined by the box) of the spot EDS analysis shown in FIGS. 20. In FIG. 19 the box which corresponds with Arrow B shows the location (i.e., the area defined by the box) of the spot EDS analysis shown in FIG. 21. FIGS. 17 and 19 show the microstructures that are eta phase, as well as the microstructures that are fibrous tungsten carbide grains. As mentioned above, the fibrous tungsten carbide grains were the result of the partial conversion of the eta phase into tungsten carbide and the evaporation of the cobalt, which was present from the conversion of the eta phase, from the surface of the substrate during the sintering at vacuum within the temperature range of 1250° C. and 2000° C. Similar microstructures (i.e., eta phase and fibrous tungsten carbide grains) are observed at the center of the insert shown in FIG. 17.

Figure 22:
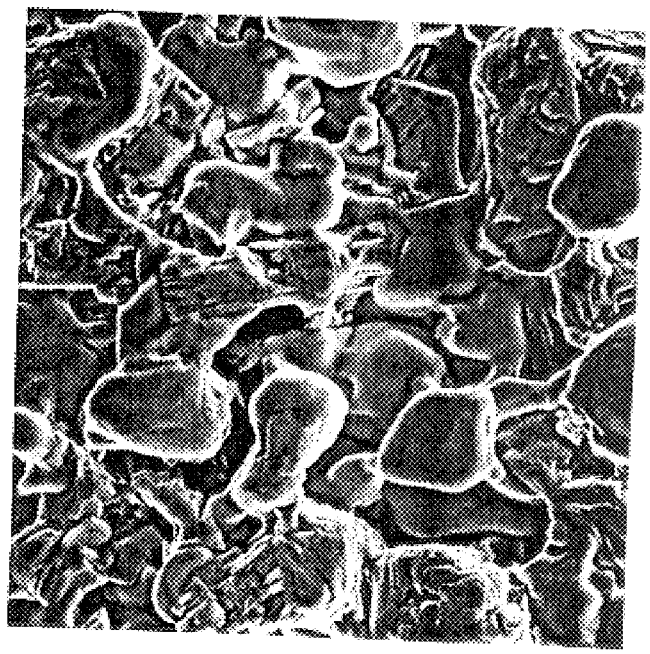
FIG. 22 is a scanning electron microscope (SEM) photomicrograph which depicts secondary electron images (SEI) at a magnification of 5000× of the surface of the center section of the cutting insert shown in FIG. 17.
Figure 23:
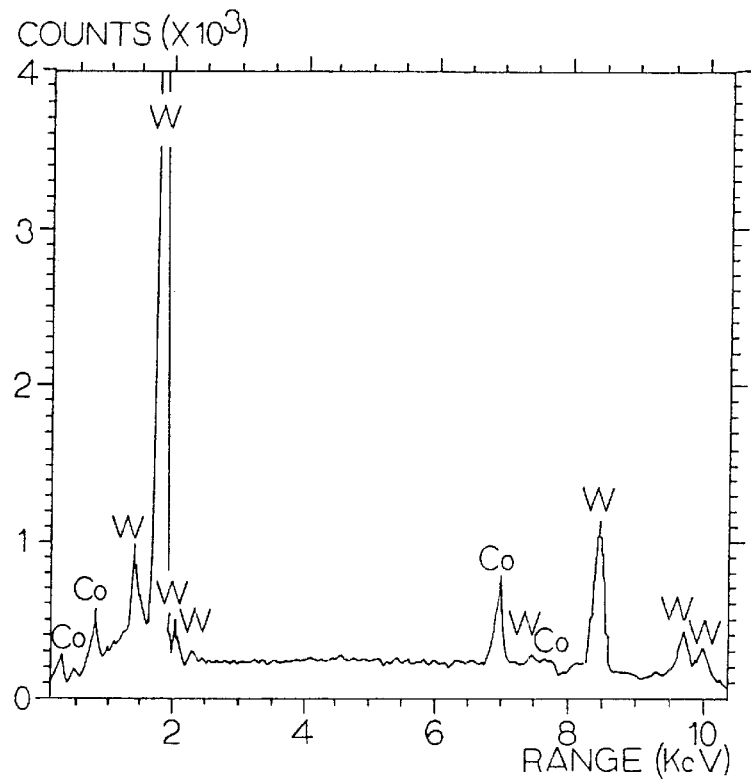
FIG. 23 is a graph which displays the results of a SEM energy dispersive line scan (EDS) analysis of the cutting insert of FIG. 22 at its center section wherein the peaks represent tungsten (W) and cobalt (Co) where indicated.

FIG. 22 is an SEM photomicrograph at 5000× magnification of the surface of the center of the cutting insert shown in FIG. 17. FIG. 23 is an EDS spectrum of the surface area (i.e., center) shown in FIG. 22. The SEM and EDS results set forth in FIGS. 22 and 23, and when coupled with the XRD results of the same cutting insert as shown in FIG. 6, show that the structure of the surface is composed largely of eta phase with fibrous tungsten carbide grains growing from the eta phase as described above. The growth of the fibrous tungsten carbide grains enhance (i.e., increase) the surface roughness, which provides for the enhanced adhesion of the diamond coating to the cutting insert substrate.

It is apparent that there is a distinction in the microstructure at the surface of the cutting insert of FIGS. 11–16 and the cutting insert of FIGS. 17–23. This distinction is the absence of eta phase and fibrous tungsten carbide grains from the center surface of the cutting insert substrate of FIGS. 11–16 in contrast to the presence of eta phase and fibrous tungsten carbide grains at the center surface of the cutting insert substrate of FIGS. 17–23. Both cutting insert substrates had eta phase and fibrous tungsten carbide grains at the corner and edge surfaces.

Applicants believe that reasons exist which explain the difference in the microstructure between the cutting insert substrate of FIGS. 11–16 and the cutting insert substrate of FIGS. 17–23. These reasons pertain to the difference in the cobalt content of the cutting insert substrates and the difference in the mass of the cutting insert substrate adjacent the center and adjacent the edges and corners thereof.

The cutting insert substrate of FIGS. 11–16 had a greater cobalt content (i.e., 5.7–6.3 wt. %) than the cutting insert substrate of FIGS. 17–23 (i.e., 2.3–2.9 wt. %). For the higher cobalt cutting insert substrate of FIGS. 11–16, there was more carbon available for migration during the heat treatment to correct the carbon deficiency due to the presence of the eta phase. For the lower cobalt cutting insert substrate of FIGS. 17–23, there was little, if any, carbon available to correct the carbon deficient due to the presence of eta phase. Thus, there was the tendency in the higher cobalt cutting insert substrate to correct the eta phase while in the lower cobalt cutting insert such a tendency was slight, if at all. There was more mass of material adjacent to the center surface of the cutting insert substrate than was adjacent to the edges (and corners) of the cutting insert substrate. Thus, the migration of carbon, to the extent it occurred, was more vigorous adjacent to the center surface of the cutting insert substrate than at the edges of the cutting insert substrate.

These reasons reveal that the more vigorous migration of carbon at the center section of the higher cobalt cutting insert substrate resulted in the correction of eta phase, and hence, the absence of eta phase at the center surface. The absence of any eta phase would, of course, result in the absence of fibrous tungsten carbide grains due to the conversion of eta phase.

Because of the less vigorous migration of carbon at the edges, the edge and corner surfaces of the higher cobalt cutting insert substrate had eta phase and fibrous tungsten carbide grains, due to the partial conversion of the eta phase, present threat. The absence of carbon to correct the eta phase in the lower cobalt cutting insert substrate resulted in the presence of eta phase and fibrous tungsten carbide grains, due to the partial conversion of the eta phase, at both the center surface and at the edge and corner surfaces.

Figure 26:
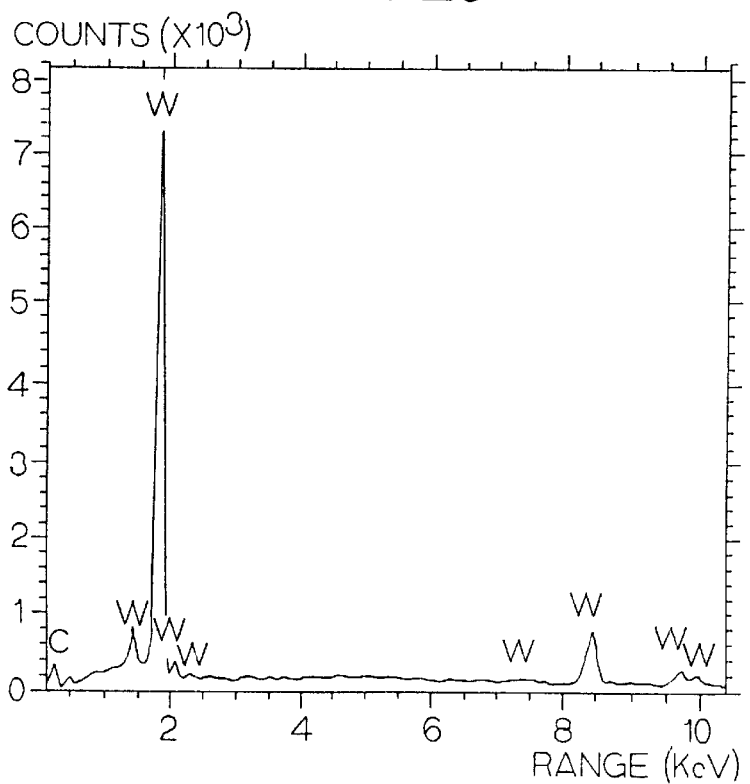
FIG. 26 is a graph which displays the results of a SEM energy dispersive line scan (EDS) analysis at a 200× field of the surface of the edge of the cutting insert of FIG. 24, wherein the peaks represent tungsten (W) and carbon (C) where indicated.
Figure 24:
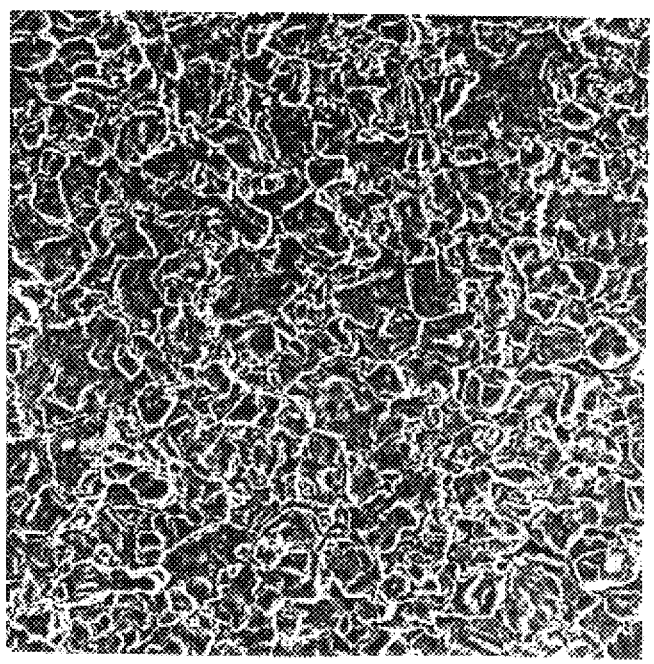
FIG. 24 is a scanning electron microscope (SEM) photomicrograph which depicts secondary electron images (SEI) at a magnification of 1000× of the surface near the edge of a cutting insert of Composition No. 1 (Table I) processed according to Process No. 1 (Table II)
Figure 25:
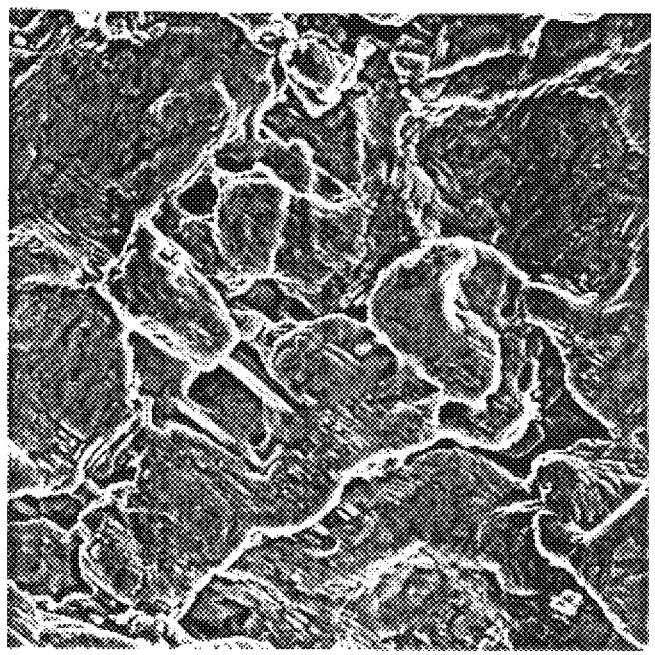
FIG. 25 is a scanning electron microscope (SEM) photomicrograph which depicts secondary electron images (SEI) at a magnification of 5000× of the surface near the edge of the cutting insert of FIG. 24.

FIGS. 24 and 25 show SEM photomicrographs at different magnifications taken at the surface of the edge of a substrate of Composition No. 1 which was processed according to Process No. 1. FIG. 26 shows an EDS spectrum of the surface of the same area of the substrate as shown in FIGS. 24 and 25. No cobalt was observed in the EDS spectrum.

Figure 27:
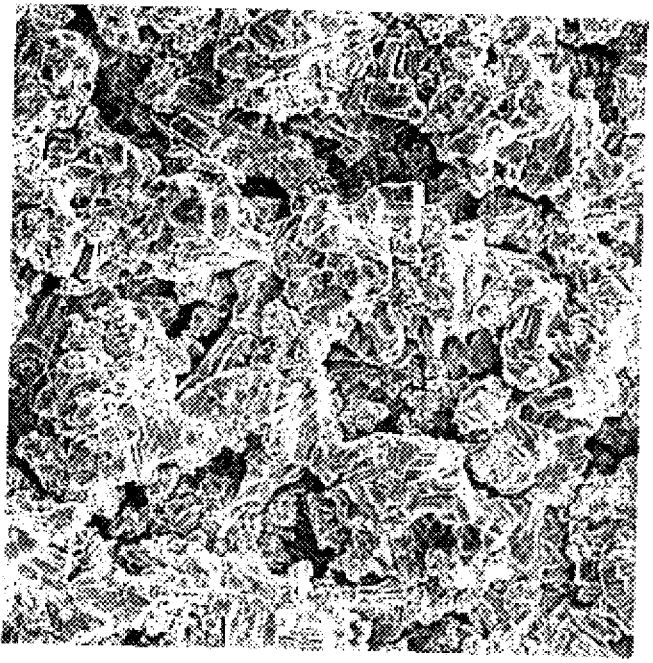
FIG. 27 is a scanning electron microscope (SEM) photomicrograph which depicts secondary electron images (SEI) at a magnification of 1000× of the surface of the center portion of the cutting insert of FIG. 24.
Figure 28:
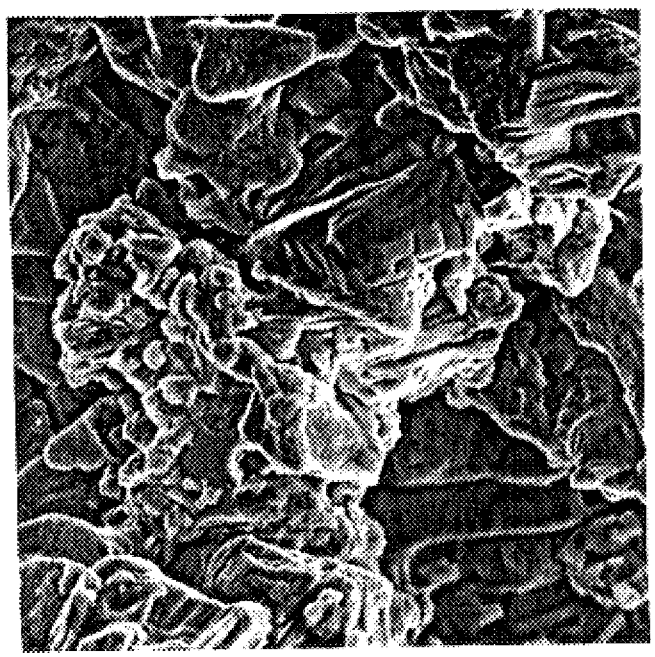
FIG. 28 is a scanning electron microscope (SEM) photomicrograph which depicts secondary electron images (SEI) at a magnification of 5000× of the surface of the center portion of the cutting insert of FIG. 24.
Figure 29:
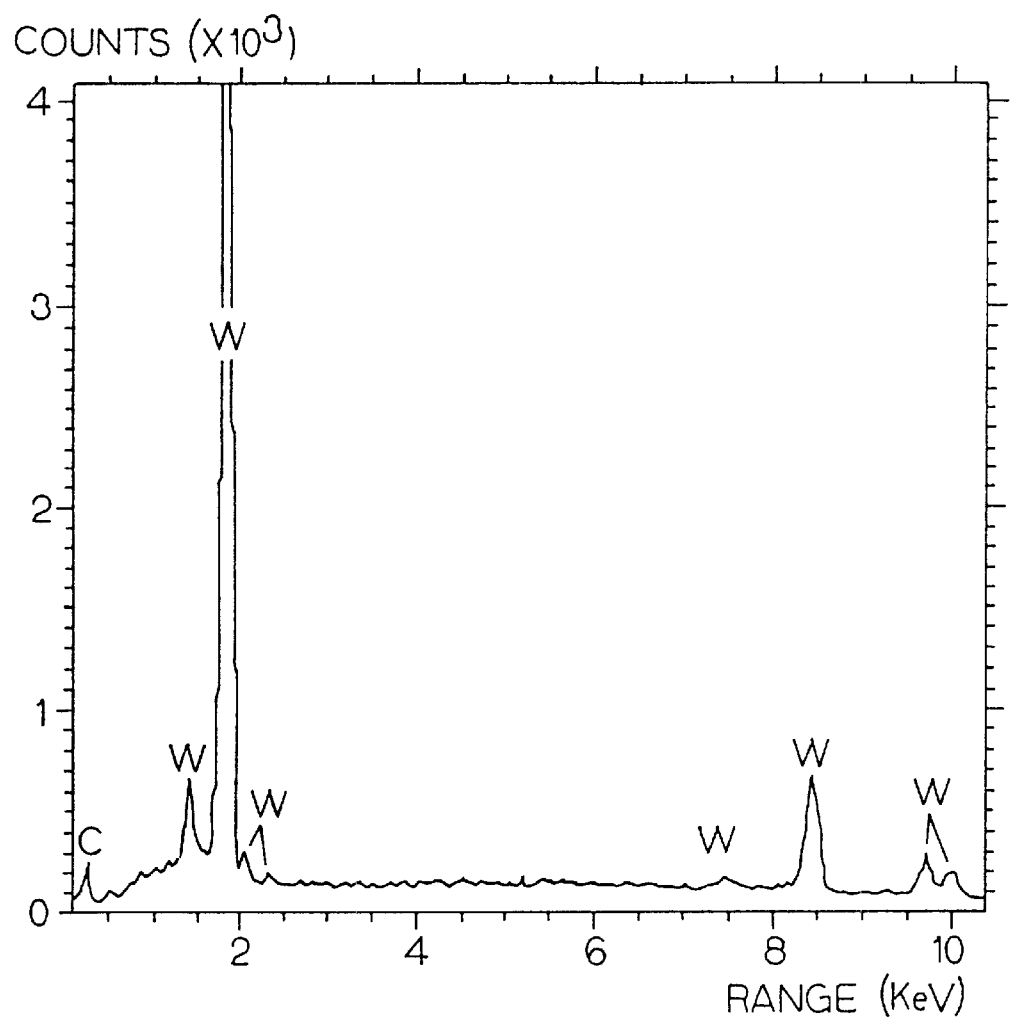
FIG. 29 is a graph which displays the results of a SEM energy dispersive line scan (EDS) analysis at a 200× field of the center section of the cutting insert of FIG. 27 wherein the peaks represent tungsten (W) and carbon (C) where indicated.

FIGS. 27 and 28 show SEM photomicrographs at different magnifications of the surface at the center of the same substrate shown in FIGS. 24 and 25. FIG. 29 shows an EDS spectrum of the surface of the same area (i.e., center) shown in FIGS. 27 and 28, but at 200× magnification. Once again no cobalt peak was observed in the EDS spectrum. This is the same substrate for which the XRD spectrum is shown in FIG. 7, and which shows that $M_6C$. eta phase was present.

A comparison of FIGS. 24 and 25 with FIGS. 11 and 12 and FIGS. 17 and 19 shows microstructures that look very much similar in that there existed eta phase partially converted to fibrous tungsten carbide grains along with cobalt evaporation. These figures (FIGS. 24, 25, 11, 12, 17 and 19) show that more eta phase was converted to fibrous tungsten carbide grains in the cutting insert substrate processed at the higher temperature of 1450° C. [Process No. 1 and FIGS., 24 and 25] as compared to the lower temperature of 1310° C. [Process No. 2 and FIGS. 11, 12, 17 and 19].

Similarly, a comparison of FIGS. 27 and 28 with FIG. 22 shows a similar result in that more eta phase was converted into fibrous tungsten carbide grains at the center of the substrate subjected to the higher temperature of 1450° C. (FIGS. 27 and 28) as compared to the lower temperature of 1310° C. The increase in the conversion of the eta phase to fibrous tungsten carbide grains due to the higher temperatures produced a substrate with excellent surface roughness for good diamond coating adhesion. Furthermore, the surface of the substrate was devoid of free cobalt due to either the evaporation of cobalt and/or the combining of the cobalt with tungsten and carbon as eta phase. Since there was no free cobalt, there was no cobalt to react with a diamond coating. Such a reaction between diamond and cobalt is known to result in the poor adhesion of the diamond film.

When a sample of Composition No. 1 was processed according to Process No. 1, but the temperatures T3 and T4 were 1500° C. instead of 1450° C., the XRD pattern taken on the top face of the cutting insert substrate showed that WC, $W_2C$, and $M_6C$. type eta phase were present. The results of SEM and EDS analysis of such a sample (Composition No. 1/Process No. 1 at T3 and T4 equal to 1500° C.) were similar to those shown in FIGS. 24 through 29 hereof in that the substrate had eta phase and fibrous tungsten carbide grains which resulted in a surface roughness adequate to provide good adhesion of a diamond coating.

Figure 30:
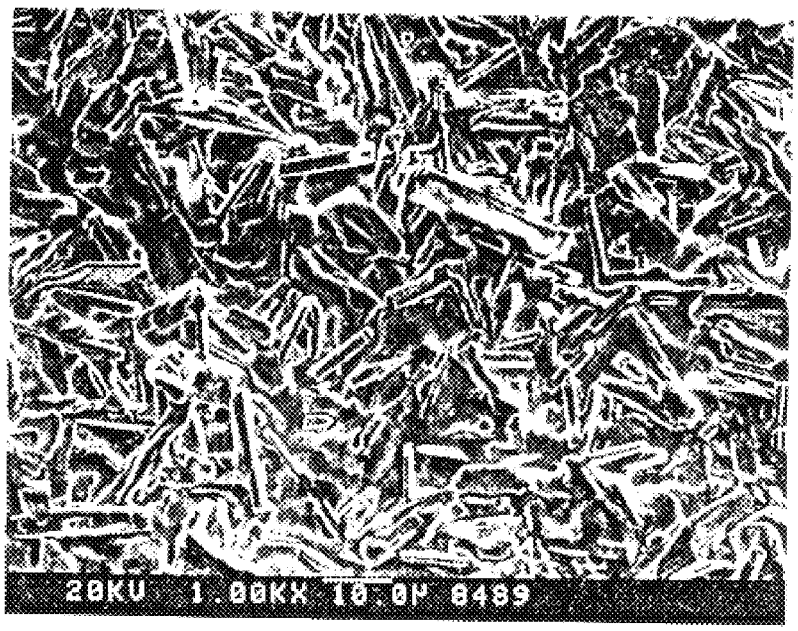
FIG. 30 is a scanning electron microscope (SEM) photomicrograph which depicts secondary electron images (SEI) at a magnification of 1000× of the surface of the tip section of a fiberglass router.

Another example of the invention comprised making a fiberglass router in Composition No. 1. The substrate was oxidized so as to form eta phase at the surface, then sintered at 1510° C. for three hours and then coated with diamond by the arc jet technique. FIG. 30 shows a photomicrograph of the surface of the tip portion of the fiberglass router prior to the application of the diamond coating.

Figure 32:
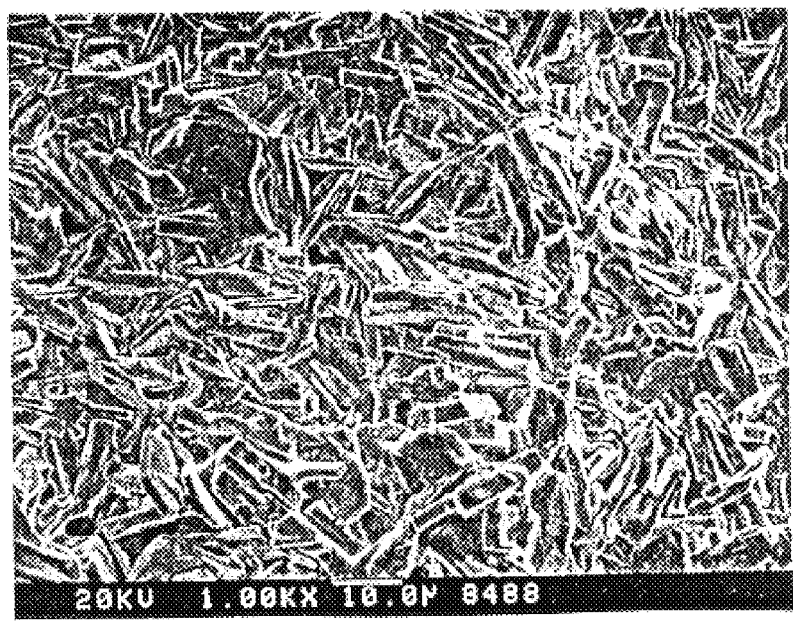
FIG. 32 is a scanning electron microscope (SEM) photomicrograph which depicts secondary electron images (SEI) at a magnification of 1000× of the surface of the center section of the fiberglass router of FIG. 30.
Figure 31:
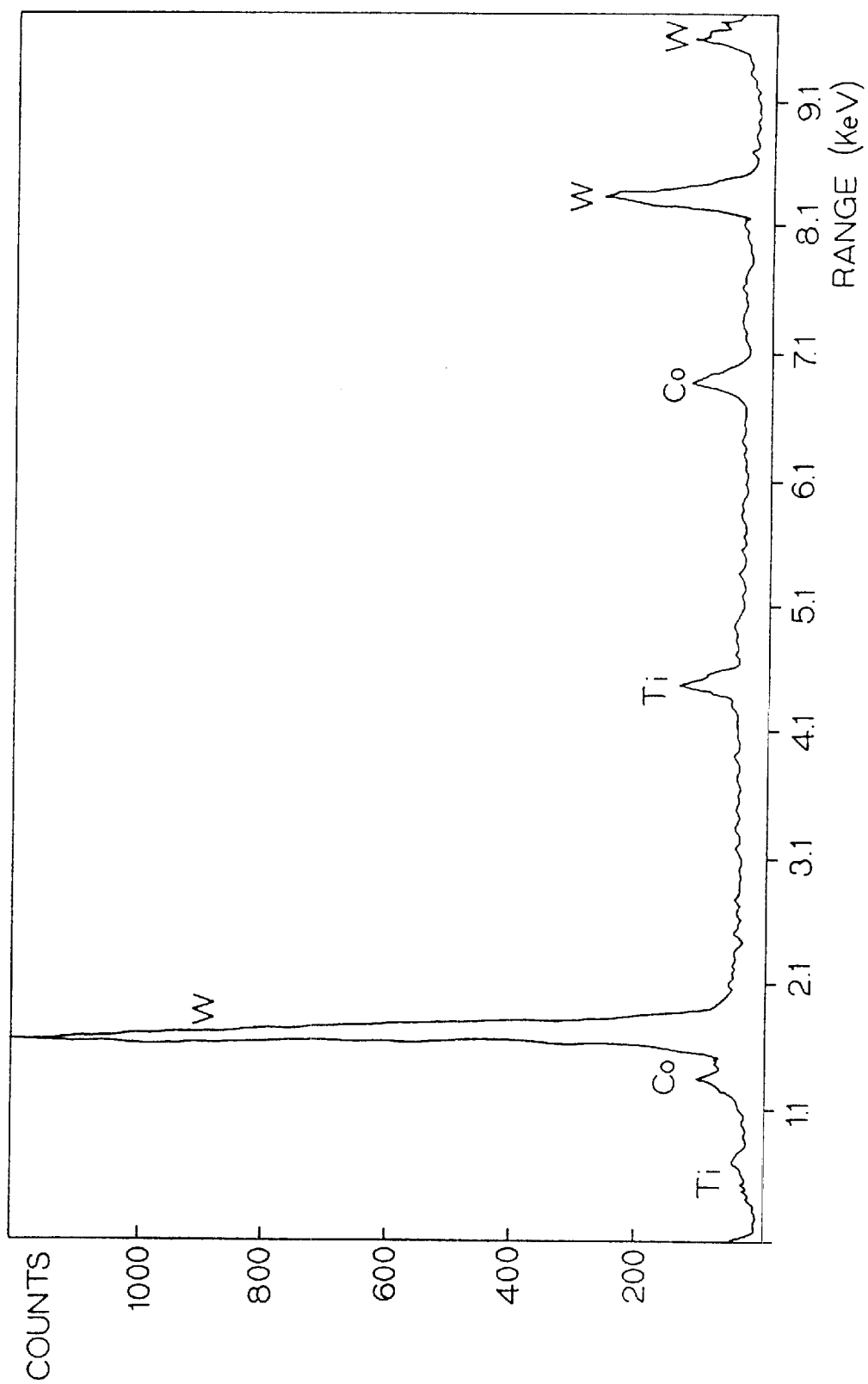
FIG. 31 is a graph which displays the results of a SEM energy dispersive line scan (EDS) analysis of the tip section of the fiberglass router of FIG. 30 wherein the peaks represent tungsten (W), cobalt (Co) and titanium (Ti) where indicated.

FIG. 31 shows the results of the EDS analysis of the surface at the tip portion of the fiberglass router of FIG. 30. It is apparent that eta phase and fibrous tungsten carbide grains were present at the surface of the substrate. FIG. 32 shows a photomicrograph of the surface of the center portion of the fiberglass router prior to the application of the diamond coating.

Figure 33:
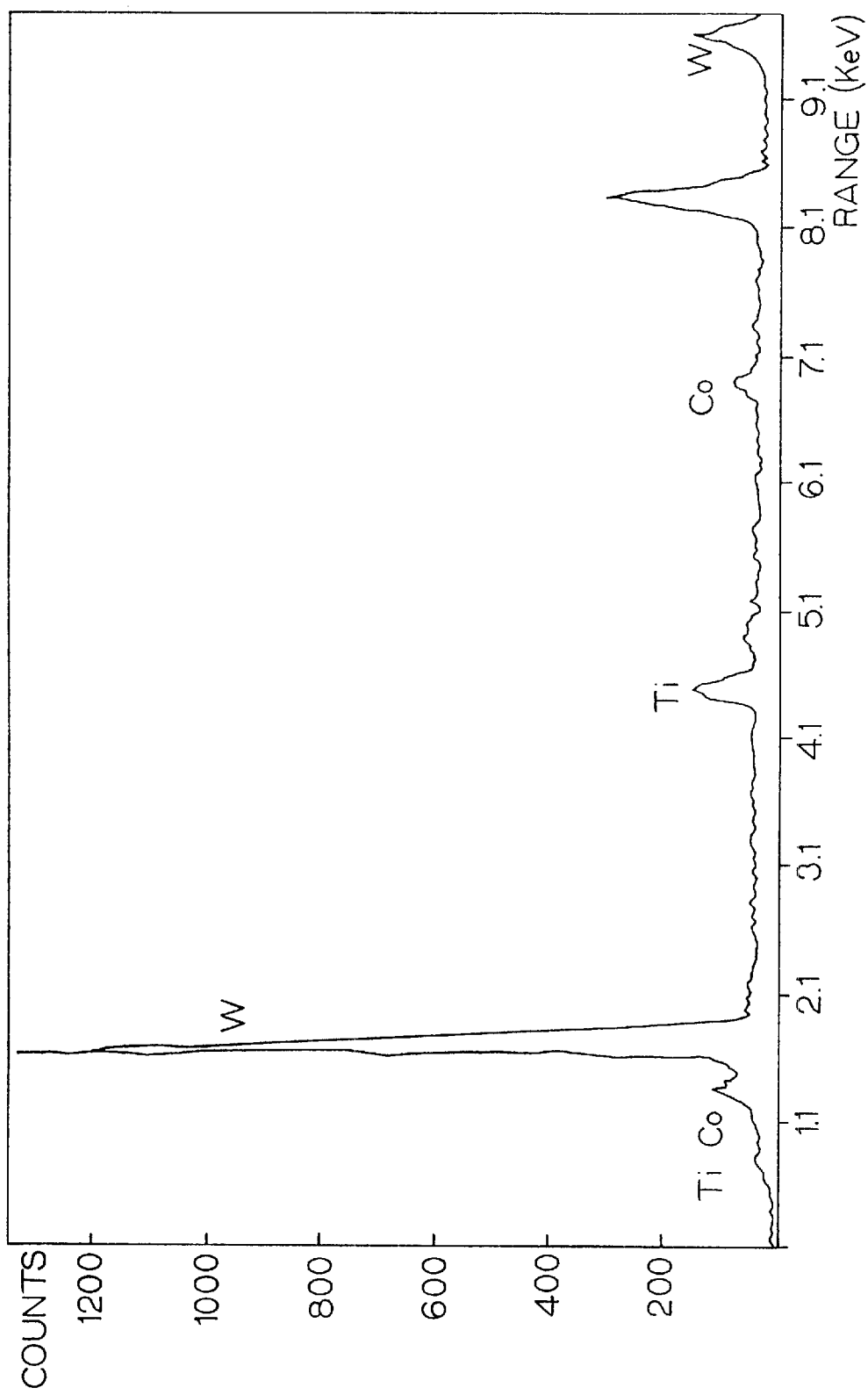
FIG. 33 is a graph which displays the results of a SEM energy dispersive line scan (EDS) analysis of the center section of the fiberglass router of FIG. 30 wherein the peaks represent tungsten (W), cobalt (Co), and titanium (Ti) where indicated.

FIG. 33 shows the results of the EDS analysis of the surface at the center portion. It is apparent that eta phase with the fibrous tungsten carbide grain growth is present at the surface of the substrate.

The fiberglass router was tested by machining a carbon graphite panel used in an airplane wherein the general shape of the panel was similar to the shape of a very large automobile windshield having complex compound curves. The machining operation required the removal of excess ragged edges of the material to produce a precisely dimensioned part. More specifically, the removal was done by passing the ⅜th inch (0.952 cm) diameter fiberglass router through the 3/16th inch (0.476 cm) thick panel so as to traverse the entire periphery of the part until the excess material falls to the floor. The next step required feeding the fiberglass router 0.050 inches (1.27 cm) inward to make a finish pass on the periphery so as to arrive at the final size and finish. The length of each pass was 12 feet (3.94 meters). The rough cut was made at 7000 revolutions per minute (rpm) and 60 inches per minute (ipm) [152.4 centimeters per minute]. The finish cut was made at 7000 rpm and 80 ipm (203.2 cm/minute).

In the past, an uncoated fiberglass router which had been used to finish the previous part was used to rough cut the next part. Then a new fiberglass router was used to finish the rough-cut part. The coated fiberglass router was able to rough cut and finish cut the part.

It thus becomes apparent that the instant invention provides for a diamond coated cutting insert wherein the diamond coating is strongly adherent to the surface of the substrate, the diamond coating may be applied in sufficiently great thickness to provide for sufficient tool life, and the surface roughness of the workpiece is sufficiently smooth.

While the invention has been described in detail with respect to diamond coated indexable cutting inserts for metalcutting applications, it is not limited to cutting inserts for metalcutting. The present invention may be applied to round tools (e.g., drills, end mills, taps, reamers, burrs, routers, thread mills and circular saws), and other cutting inserts which may not be indexable. Cutting inserts in accordance with the present invention may also be suitable for the removal of material from workpieces such as freemachining aluminum alloys, high silicon aluminum, nonferrous materials (e.g., copper, bronze, and brass), ceramics materials, fiber-reinforced materials, graphite laminates, nylons, acrylics, phenolic resin materials, metal matrix composites (e.g., silicon carbide or alumina in an aluminum matrix), plastic, rubber and wood. The present invention may also have application as a wear part (e.g., TAB bonders for electronic applications, dies, and punches) and for cemented carbide tips used in mine tools, construction tools, and drilling tools for earth and rock.

The patents and other documents identified herein are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A process for making a coated body comprising the steps of:

providing a substrate comprising tungsten, carbide and cobalt, and the substrate having at least one surface with eta phase thereon due to a formation treatment;

subjecting the substrate with eta phase on the surface thereof to a conversion heat treatment at a temperature between about 1250° C. and about 2000° C. under at least a partial vacuum for a duration sufficient as to convert at least a portion of the eta phase to fibrous tungsten carbide grains wherein the fibrous tungsten carbide grains are at the surface so that the substrate surface thereby presents a surface roughness, $R_a$, of greater than 12 microinches; and applying a coating to the surface of the substrate.

2. The process of claim 1 wherein the formation treatment comprises decarburizing the surface of the substrate, and then subjected the decarburized surface of the substrate to a heat treatment at a temperature of at least 700° C. so as to form eta phase at the surface of the substrate.

3. The process of claim 1 wherein the formation treatment comprises subjecting the substrate to an atmosphere of hydrogen and carbon dioxide so as to form eta phase at the surface of the substrate.

4. The process of claim 1 wherein the conversion heat treatment occurs at a temperature of between about 1310° C. and about 1550° C.

5. The process of claim 4 wherein the duration of the conversion treatment is between about three hours and about five hours.

6. The process of claim 1 wherein the conversion treatment occurs under a vacuum.

7. The process of claim 1 wherein the fibrous tungsten carbide grains take the form of one or both of monotungsten carbide (WC) and/or di-tungsten carbide ($W_2C$).

8. The process of claim 1 wherein the coating is diamond.

9. The process of claim 8 wherein the substrate is at a temperature between about 700° C. and about 1000° C. during the application of the diamond coating.

10. The process of claim 1 wherein the powder mixture further comprises up to about 0.4 weight percent tantalum up to about 0.1 weight percent titanium, up to about 0.1 weight percent niobium, and the cobalt comprising between about 2.3 weight percent and about 2.9 weight percent of the mixture.

11. The process of claim 1 wherein the powder mixture further comprises up to about 0.1 weight percent tantalum, up to about 0.1 weight percent titanium, up to about 0.1 weight percent niobium, between about 0.3 weight percent and about 0.5 weight percent chromium, and the cobalt comprising between about 5.7 weight percent and about 6.3 weight percent of the mixture.

12. The process of claim 1 wherein during the conversion treatment the cobalt from the eta phase converted to fibrous tungsten carbide grains evaporates from the substrate.

13. The process of claim 1 wherein during the conversion treatment the cobalt from the eta phase converted to fibrous tungsten carbide grains combines with tungsten and carbon to form eta phase.

14. A process for making a coated body comprising the steps of:
   providing a substrate comprising tungsten carbide and cobalt; the substrate presenting at least one surface; and the substrate having been subjected to a roughening heat treatment so as to cause grain growth of the tungsten carbide grains so that the surface of the substrate has a surface roughness, $R_a$, of at least 12 microinches, and the roughening heat treatment causing the reduction of the concentration of the cobalt at the surface of the substrate;
   oxidizing the surface of the substrate which has been subjected to the roughening heat treatment so as to form eta phase at the surface of the substrate;
   subjecting the substrate with eta phase at the surface thereof to a conversion heat treatment at a temperature between about 1250° C. and about 2000° C. under at least a partial vacuum for a duration sufficient as to convert at least a portion of the eta phase to fibrous tungsten carbide grains so that the fibrous tungsten carbide grains are at the surface wherein the substrate surface presents a surface roughness, $R_a$, of greater than 12 microinches; and
   applying a coating to the surface of the substrate.

15. The process of claim 14 wherein the conversion heat treatment occurs at a temperature of between about 1310° C. and about 1550° C.

16. The process of claim 14 wherein the duration of the conversion treatment is between about three hours and about five hours.

17. The process of claim 14 wherein the conversion treatment occurs under a vacuum.

18. The process of claim 14 wherein the fibrous tungsten carbide grains take the form of monotungsten carbide (WC) and/or di-tungsten carbide ($W_2C$).

19. The process of claim 14 wherein the coating is diamond.

20. The process of claim 19 wherein the substrate is at a temperature between about 700° C. and about 1000° C. during the application of the diamond coating.

21. The process of claim 1 wherein the substrate surface presents a surface roughness, $R_a$, of greater than about 15 microinches.

22. The process of claim 1 wherein the substrate surface presents a surface roughness, $R_a$, of greater than about 20 microinches.

23. The process of claim 1 wherein the cobalt is absent from the substrate surface.

24. The process of claim 1 wherein the conversion treatment occurs under a pressure of less than 0.5 torr.

25. The process of claim 1 wherein the conversion treatment occurs under a pressure of less than 0.5 torr nitrogen.

26. The process of claim 1 wherein the conversion treatment occurs at a temperature between about 1500 degrees Centigrade and about 2000 degrees Centigrade and under a pressure of 0.5 torr.

27. The process of claim 1 wherein the conversion treatment occurs at a temperature between about 1500 degrees Centigrade and about 2000 degrees Centigrade and under a vacuum.

28. The process of claim 14 wherein the substrate surface presents a surface roughness, $R_a$, of greater than about, 15 microinches.

29. The process of claim 14 wherein the substrate surface presents a surface roughness, $R_a$, of greater than about 20 microinches.

30. The process of claim 14 wherein the cobalt is absent from the substrate surface.

31. The process of claim 14 wherein the conversion treatment occurs under a pressure of less than 0.5 torr.

32. The process of claim 14 wherein the conversion treatment occurs under a pressure of less than 0.5 torr nitrogen.

33. The process of claim 14 wherein the conversion treatment occurs at a temperature between about 1500 degrees Centigrade and about 2000 degrees Centigrade and under a pressure of 0.5 torr.

34. The process of claim 14 wherein the conversion treatment occurs at a temperature between about 1500 degrees Centigrade and about 2000 degrees Centigrade and under a vacuum.

* * * * *